United States Patent [19]

Temple et al.

[11] Patent Number: 5,135,890
[45] Date of Patent: Aug. 4, 1992

[54] METHOD OF FORMING A HERMETIC PACKAGE HAVING A LEAD EXTENDING THROUGH AN APERTURE IN THE PACKAGE LID AND PACKAGED SEMICONDUCTOR CHIP

[75] Inventors: Victor A. K. Temple; Donald L. Watrous, both of Clifton Park; Constantine A. Neugebauer; James F. Burgess, both of Schenectady; Homer H. Glascock, II, Scotia, all of N.Y.

[73] Assignee: General Electric Company, Schenectady, N.Y.

[21] Appl. No.: 765,286

[22] Filed: Sep. 25, 1991

Related U.S. Application Data

[62] Division of Ser. No. 367,525, Jun. 16, 1989.

[51] Int. Cl.⁵ .................. H01L 21/60; H01L 21/603
[52] U.S. Cl. .................................. 437/215; 437/183; 437/216; 437/218
[58] Field of Search .............. 437/215, 216, 218, 183; 357/74; 148/DIG. 126

[56] References Cited

U.S. PATENT DOCUMENTS

| | | | |
|---|---|---|---|
| 3,740,619 | 6/1973 | Rosvold | 357/70 |
| 4,023,198 | 5/1977 | Malone et al. | 357/74 |
| 4,276,558 | 6/1981 | Ho et al. | 357/74 |
| 4,338,621 | 7/1982 | Braun | 357/74 |
| 4,544,989 | 10/1985 | Nakabu et al. | 357/81 |
| 4,616,406 | 10/1986 | Brown | 437/215 |
| 4,751,482 | 6/1988 | Fukuta et al. | 357/74 |
| 4,791,075 | 12/1988 | Lin | 437/215 |
| 4,807,021 | 2/1989 | Okumura | 357/75 |
| 4,878,846 | 11/1989 | Schroeder | 357/75 |
| 4,903,120 | 2/1990 | Breen et al. | 357/75 |

FOREIGN PATENT DOCUMENTS 57-32661A 2/1982 Japan .
61-225829 10/1986 Japan .

Primary Examiner—Brian E. Hearn
Assistant Examiner—C. Chaudhari
Attorney, Agent, or Firm—Marvin Snyder; James C. Davis, Jr.

[57] ABSTRACT

A hermetically sealed package for a semiconductor device includes a lid through which the leads of the device extend vertically away from the chip through an aperture in the lid which is hermetically sealed by the external terminal or electrode. The package is compact, lightweight and free of magnetic materials.

6 Claims, 17 Drawing Sheets

METHOD OF FORMING A HERMETIC PACKAGE HAVING A LEAD EXTENDING THROUGH AN APERTURE IN THE PACKAGE LID AND PACKAGED SEMICONDUCTOR CHIP

This application is a division of application Ser. No. 07/367,525, filed Jun. 16, 1989.

BACKGROUND OF THE INVENTION

1. Field of the Invention

The present invention relates to the field of packages for semiconductor devices and packaged devices, and more particularly, to the field of hermetic packages and hermetically packaged devices.

2. Prior Art

Power semiconductor devices have been packaged in a vast variety of package configurations. These include both hermetic (gas-tight) and non-hermetic (gas-permeable) packages. As the desired operating frequency of hermetically packaged power devices is increased, a number of problems with prior art packages become apparent. In general, prior art packages for power devices which are hermetically sealed include a metallic case or can. Such metallic cans have device leads which extend through glass seals in the sides or bottom of the can. The glass seals bond to both the lead and the can. The chip containing the device is bonded to the bottom of the can and the contact pads on the top of the device are connected to the through-the-can leads by wire bonds. After the completion of mounting and bonding the chip, a cover or lid is sealed on top of the can to hermetically seal the package.

Such packages present a number of disadvantages. First, since the wire bonds are normally made with round wire on the order of about 1 mil (0.025 mm) in diameter for low power integrated circuits and 30-40 mils (0.76-1.02 mm) in diameter for power or high current devices and are from about 0.3-0.5 inch (0.76-1.27 cm) long, they have a significant inductance in their own right. Second, the through-the-can leads are round wires about 20 to 50 mils (1-3 mm) in diameter and about 0.3-0.5 inch (0.76-1.27 cm) long. Thus, these leads also have a significant inductance in their own right. Third, the wires have a significant resistance which adds to the on-resistance of the device. Fourth, in order for the thermal coefficients of expansion of the can and the semiconductor device to be sufficiently equal that the device does not become de-bonded from the can and to prolong the life of the glass seals, the cans are normally made of Kovar ®, Invar ®, steel or other similar low thermal coefficient of expansion metals. Such metals are magnetic materials and consequently, have the effect of increasing the inductance of the wire bonds and of the through-the-can leads. Fifth, glass seals are unreliable over long periods of time and eventually begin to leak. Sixth, the metals used in the can and the leads suffer from higher electrical and thermal resistivity than copper. Seventh, such packages have the disadvantage that they are substantially larger in both major surface area and volume than the semiconductor chip and weigh many times what the chip weighs. The net result is that the final packaged chip is a heavy, bulky item which has a relatively high inductance. That relatively high inductance is undesirable for high frequency operation of the device because when coupled with the very high di/dt characteristic of high frequency operation, this inductance leads to very high di/dt voltage overshoots. This problem increases with increasing frequency of operation because inductive effects increase with increasing signal frequency.

As the complexity and power requirements of semiconductor systems have increased, an increasing need has developed for hybrid power circuits in which various semiconductor devices are interconnected to provide the overall system. Because of the relatively high weight and large size of hermetic packages for semiconductor chips, it has become a common practice in the semiconductor art to mount unpackaged chips on a substrate to form a hybrid circuit and then to enclose the entire substrate and the chips mounted thereon in a metallic hermetic package made of magnetic material in order to provide a hermetically sealed system. Such systems suffer from disadvantages similar to those which are suffered by individual chips packaged in hermetic packages. Further since unpackaged power chips cannot be tested at full current, some of the chips will not operate properly at full current. This has a substantial negative impact on the yield of hybrid circuits assembled from chips which have not been fully tested.

There is a need for a compact, hermetic, non-magnetic package for high frequency, high current power devices.

OBJECTS OF THE INVENTION

Accordingly, a primary object of the present invention is to provide a hermetically sealed package for power semiconductor devices which is lightweight and free of magnetic materials.

Another object of the invention is to provide a hermetic package which is free of glass seals and in which all of the leads are copper.

Another object of the invention is to provide a hermetically sealed package for a semiconductor device in which the leads from the top of the chip extend through the package lid in a direction substantially perpendicular to the upper surface of the device.

Still another object of the invention is to provide a hermetically sealed, compliant package in which leads extending through an aperture in the insulating portion of the lid are spaced from a portion of the aperture wall.

A further object of the invention is to provide a small, lightweight hermetic semiconductor package suitable for inclusion in hybrid circuits together with other devices which are not required to be hermetic (or which are separately hermetically sealed) in high reliability circuits.

SUMMARY OF THE INVENTION

The above and other objects which will become apparent from the remainder of the specification and the drawings are accomplished in accordance with a preferred embodiment of the present invention by a semiconductor device package comprised of a base and a lid. The base and lid, when assembled, provide a cavity in which the semiconductor device is disposed. Leads for contact pads on a first surface of the semiconductor device's chip extend through the lid perpendicular to the first surface of the chip. The lid is preferably of ceramic material and has an aperture therein at each location where a lead is to extend vertically through the lid. A conductive foil, such as copper, is bonded to the preferably ceramic body of the lid, extends across each of the apertures, provides a hermetic seal around those apertures and is preferably dimpled where it extends across an aperture in which a conductive pellet is disposed. In this embodiment, conductive pellets are disposed in the apertures, are electrically continuous with the contact pads on the semiconductor device and are preferably spaced from the aperture walls. When the package is sealed, the semiconductor chip is bonded to the base of the package and is connected to the external foil on the lid by the conductive pellets which are bonded to the conductive foil. The number of conductive pellets connected to each chip pad is determined in accordance with the expected current flow in that portion of the device circuit. The package base may include an external conductive lead connected directly to the back of the semiconductor chip via its bond to the base. Alternatively, where isolation of the package is desired, an insulating layer is included in the base of the package to isolate the chip from the bottom exterior surface of the package.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

In particular, FIG. 1 illustrates a semiconductor chip having contact pads on the upper surface thereof;

FIG. 2 illustrates the chip of FIG. 1 with solderable conductive bumps bonded to the contact pads;

FIG. 3 illustrates the screening of solder onto the conductive bumps in FIG. 2;

FIG. 4 illustrates a template aligned with the chip for aligning conductive pellets with the conductive bumps;

FIG. 5 illustrates the template/chip combination with conductive pellets in place;

FIG. 6 illustrates the chip with the conductive pellets bonded to the contact pads after removal of the template;

FIG. 7 is a detail showing a conductive pellet soldered to the conductive bumps, with the template still in place;

FIG. 8 illustrates an exterior view of the lid of the package;

FIG. 9 illustrates an interior view of the lid of the package;

FIG. 10 illustrates the chip turned upside down on the lid of the package;

FIG. 11 illustrates the base of the package;

FIG. 12 illustrates the sealed package with external terminal extensions in place;

FIG. 13 is a perspective cross-section view of the FIG. 12 structure;

DETAILED DESCRIPTION

Figure 11:
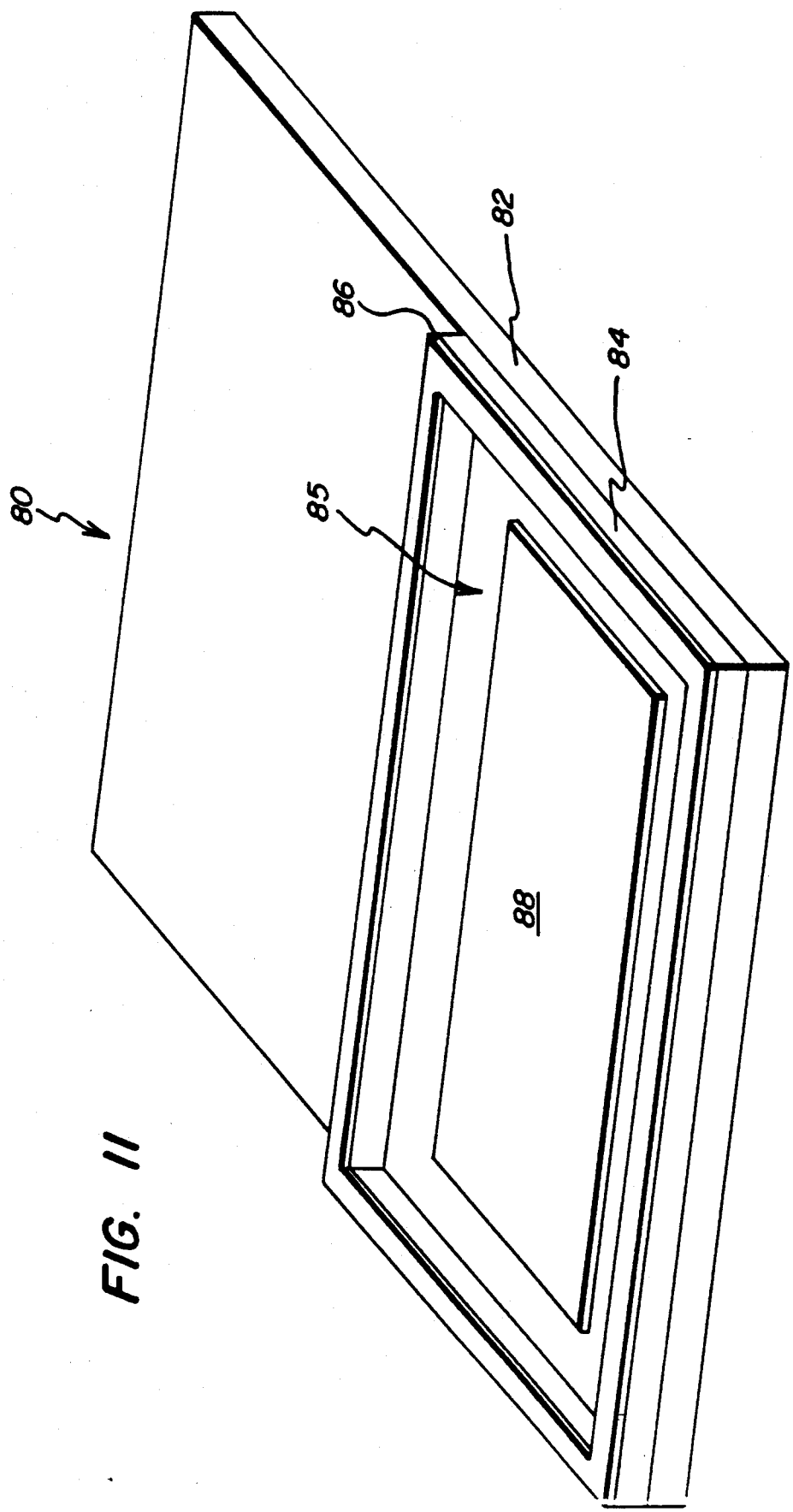
Figure 12:
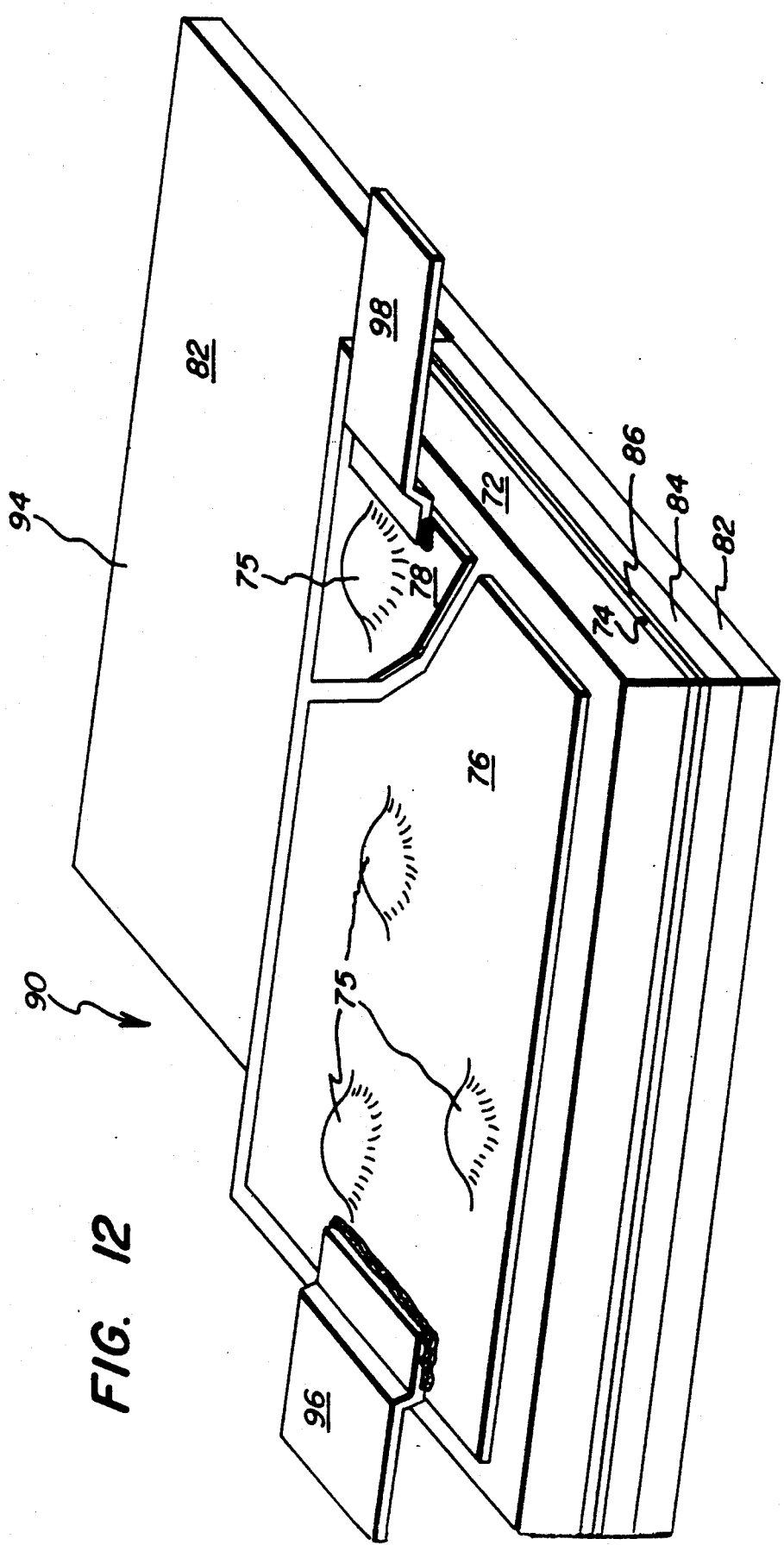
Figure 13:
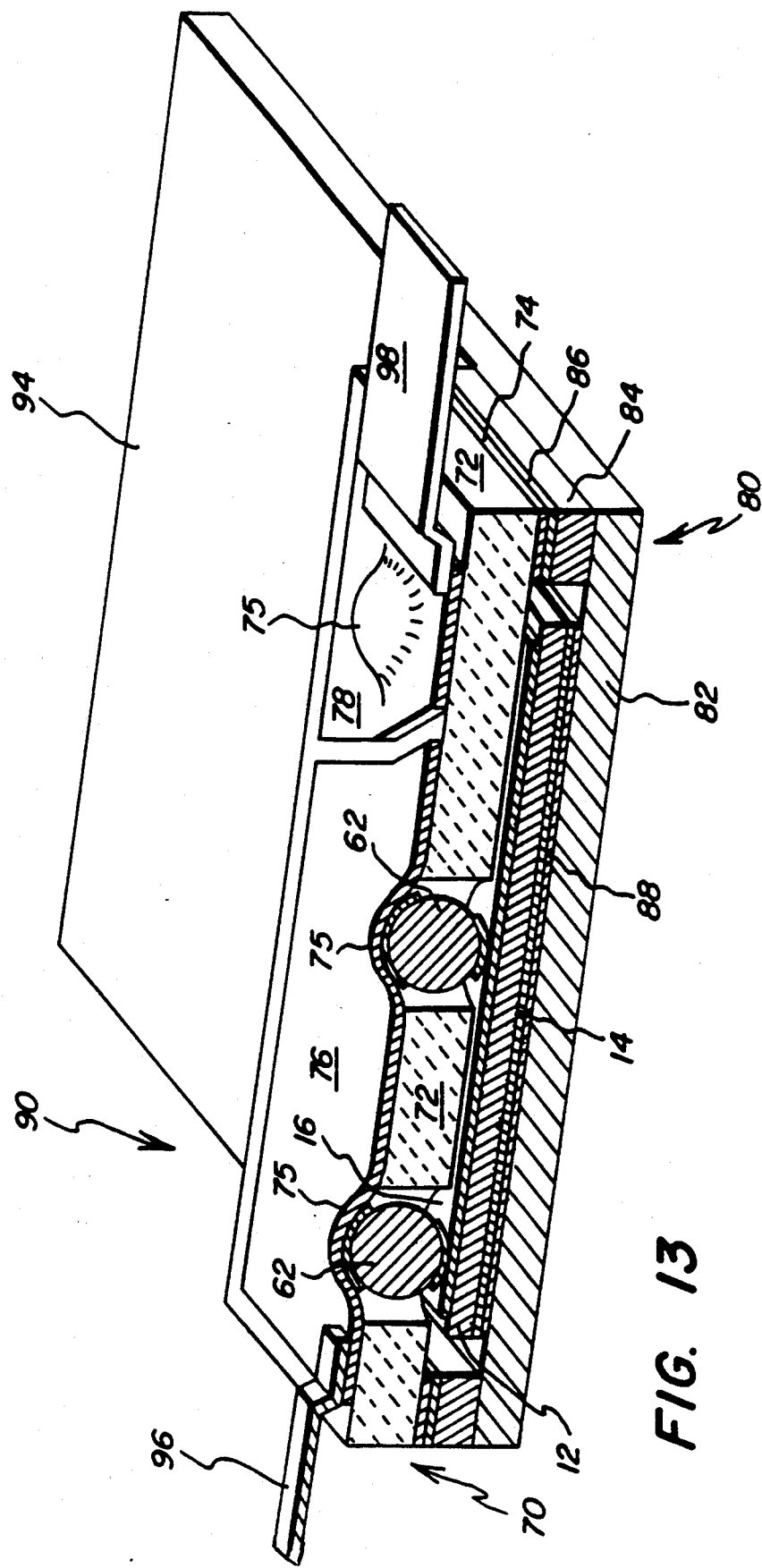

A completed, packaged semiconductor device in accordance with one embodiment of the present invention is illustrated generally at 90 in FIG. 12 in a perspective view and in FIG. 13 in a perspective cross-section view. The component parts of and the process of fabricating package will now be described in connection with FIGS. 1-13.

Figure 1:
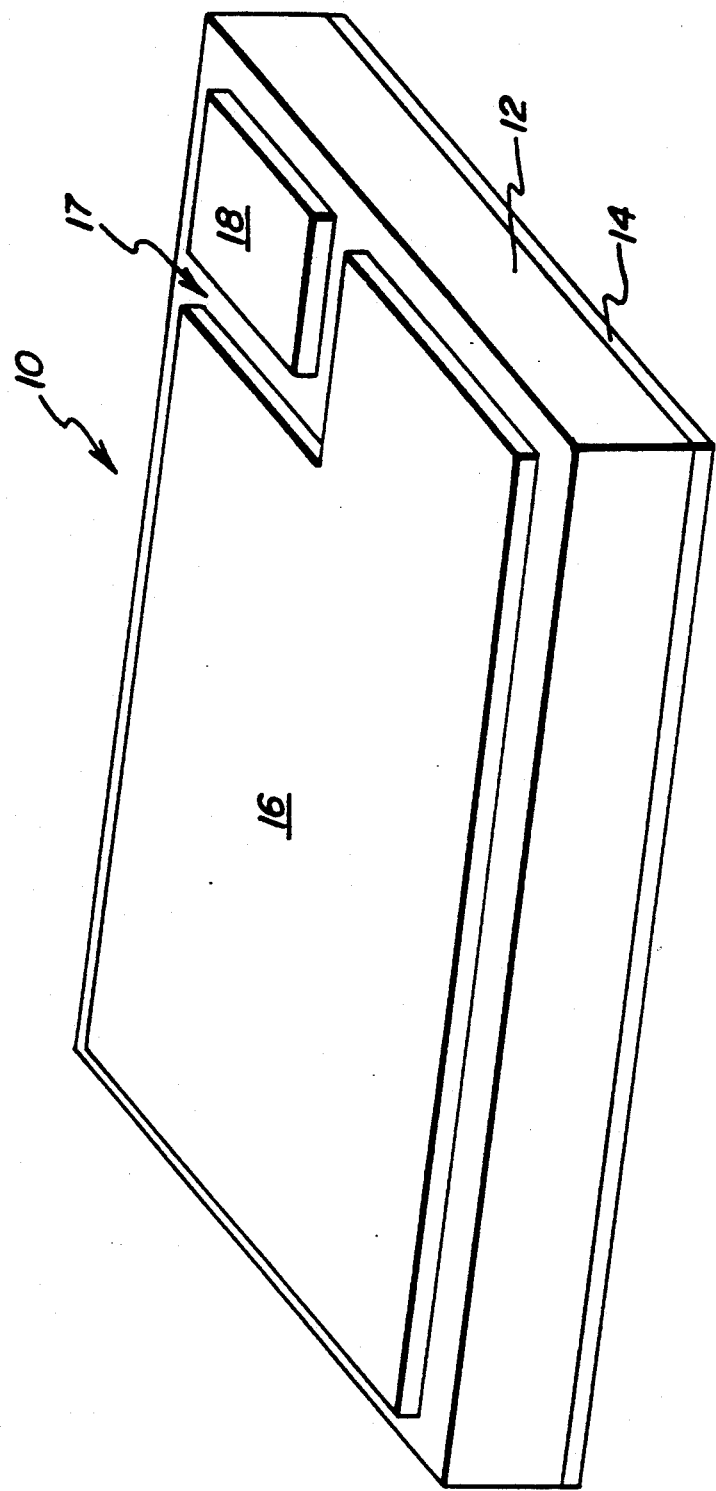
FIGS. 1-13 illustrate successive stages in the process of packaging a semiconductor device in accordance with the present invention.

In FIG. 1, a power semiconductor device chip is shown generally at 10. This device comprises a semiconductor body 12 having uniform metallization 14 disposed in ohmic contact with its lower surface. Two separate contact pads 16 and 18 are disposed in ohmic contact with the upper surface of the chip. These contact pads are spaced apart by a gap 17. Where the power semiconductor device is a field effect transistor, metallization 14 is normally the drain contact, contact pad 16 is normally the source contact and contact pad 18 is the gate contact, that is, metallization 14 and contact pad 16 are the power contacts and contact pad 18 is the control contact.

The contact pads 16 and 18 are typically aluminum in such devices and thus not directly solderable with most common solders. It is common practice to form a solderable metallization as the surface layer of the metallization 14 in order that the device may be soldered to a package base or heat sink. If desired, it is also possible to form a solderable surface on the aluminum contact pads on the upper surface of the device. Any known way of providing a solderable contact may be used including deposition of chromium on the aluminum followed by copper on the chromium or nickel may be deposited directly on the silicon, for instance. In accordance with the present invention, the contact pads 16 and 18 may be either solderable or nonsolderable.

Figure 2:
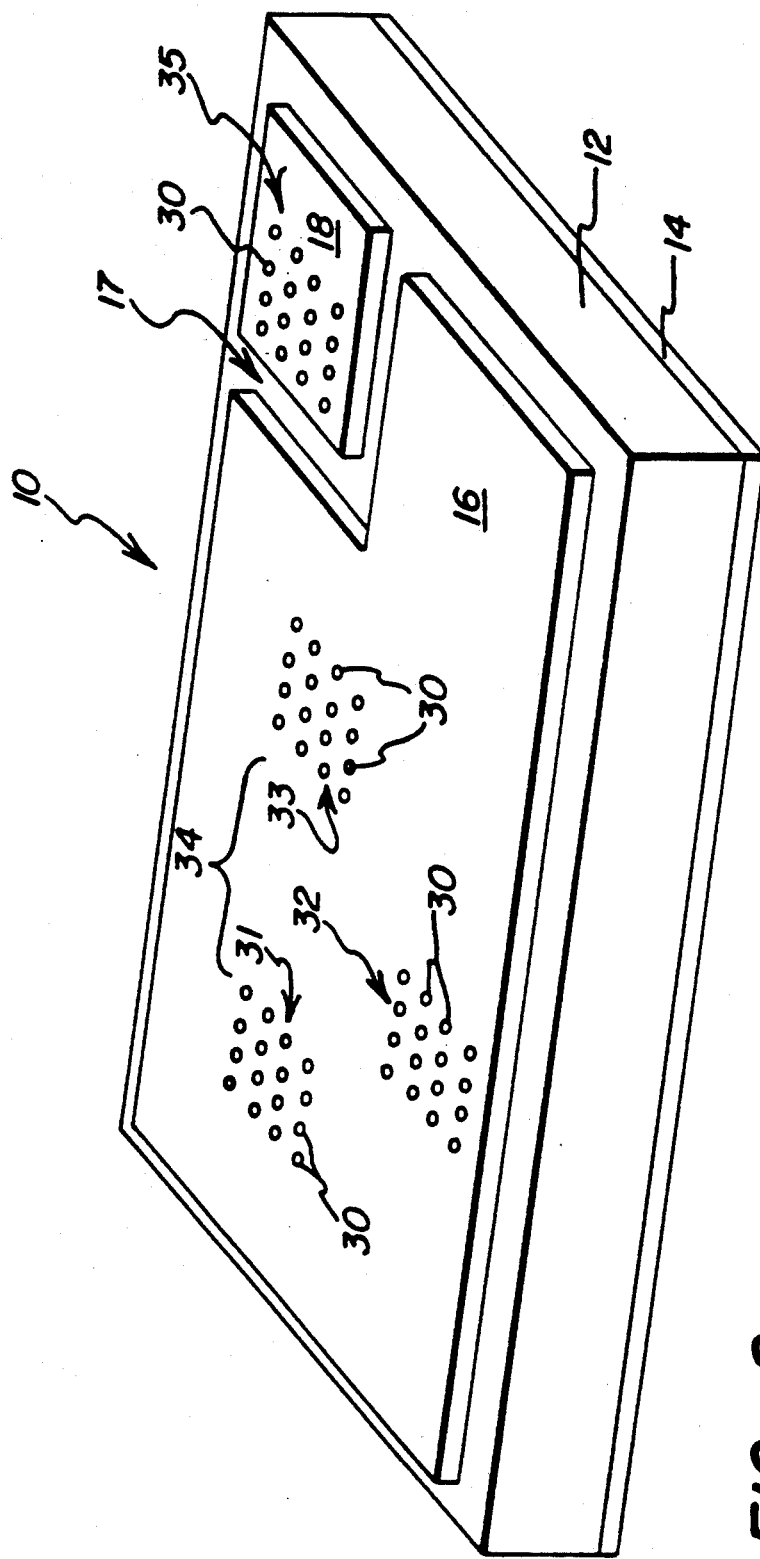

The beginning of the packaging process for a device 10 whose contact pads are non-solderable is illustrated in FIG. 2. In FIG. 2, arrays 34 and 35 of conductive bumps 30 are disposed on the contact pads 16 and 18, respectively. The conductive bumps 30 can be laid out in an orderly manner within the array of bumps or may be randomly positioned, as may be desired.

The array 34 of gold bumps disposed on the contact pad 16 is divided into three subarrays 31, 32, and 33, each of which comprise a 4×4 array of the gold bumps 30. As will become apparent hereinafter, this is for the purpose of providing three separate contact points to the contact pad 16 to thereby limit the maximum lateral current flow in the contact pad 16. The array 35 is a single 4×4 pattern of the bumps 30 because of (1) the smaller size of the pad 18, (2) the much smaller current carried therein and (3) the need for only a single contact thereto.

In a preferred embodiment, each of the conductive bumps 30 is a gold "disk" having a pancake-like upper surface. Each of these gold bumps may preferably be formed in accordance with the teachings of U.S. Pat. No. 4,750,666 to Neugebauer et al., which is incorporated herein by reference. As explained in more detail therein, a gold wire bonder is used to form these bumps. First, a gold ball is formed on the end of the gold wire and bonded to the contact pad 16 or in the same fashion as it would be bonded thereto if a gold wire bond was being formed. However, once the bump has been bonded to the contact pad, rather than releasing the wire for movement through the bonding head as is done in forming a wire bond (while the bonding head moves to the location where the other end of the wire is to be bonded), the wire is held fixed and the bonding head is moved laterally to shear the wire from the bump. This leaves a bump with a substantially smooth upper surface. However, a pigtail of the wire may be left so long as it does not interfere with the subsequent steps in the fabrication process. Conductive bumps other than gold may be employed if desired. Gold bumps are preferred at this time because of the well-established techniques for gold wire bonding which are easily modified to provide gold bumps in various locations, because of its solderability and because if thermocompression bonding is used to bond to the gold bumps, that thermocompression bonding is easier with gold bumps than with flat metallization. The use of gold bumps is also preferred because there is no yield loss at the wafer level. Alternatively, chromium copper metallization could be used with its attendant yield loss during processing at the wafer level.

The size of the gold bumps 30 is somewhat dependent on the diameter of the gold wire employed in creating the gold bumps. With 1 mil diameter gold wire, a bump about 3 mils in diameter at the pad surface and 1 mil high is produced. The use of larger diameter wire provides a larger diameter, taller bump. The individual gold bumps 30 are preferably produced by an automatic wire bonding machine which has been programmed to position the bumps in the desired locations. A wire bonding machine such as the K&S Model 1419 is effective for this purpose. The model 1419 is externally programmable with the program in use depending on the disk inserted in its disk drive, is rated to produce 2 wire bonds per second and is capable of forming more gold bumps per second since a wire bond requires the formation of a bond at each end of the wire and thus requires that the bonder contact the chip and its package twice per wire bond, whereas during bump formation, each contact produces a separate bump. Thus a very effective production process results, especially since use of gold bumps makes the provision of a solderable metallization on pads 16 and 18 unnecessary. Other bonding machines may also be utilized.

Figure 3:
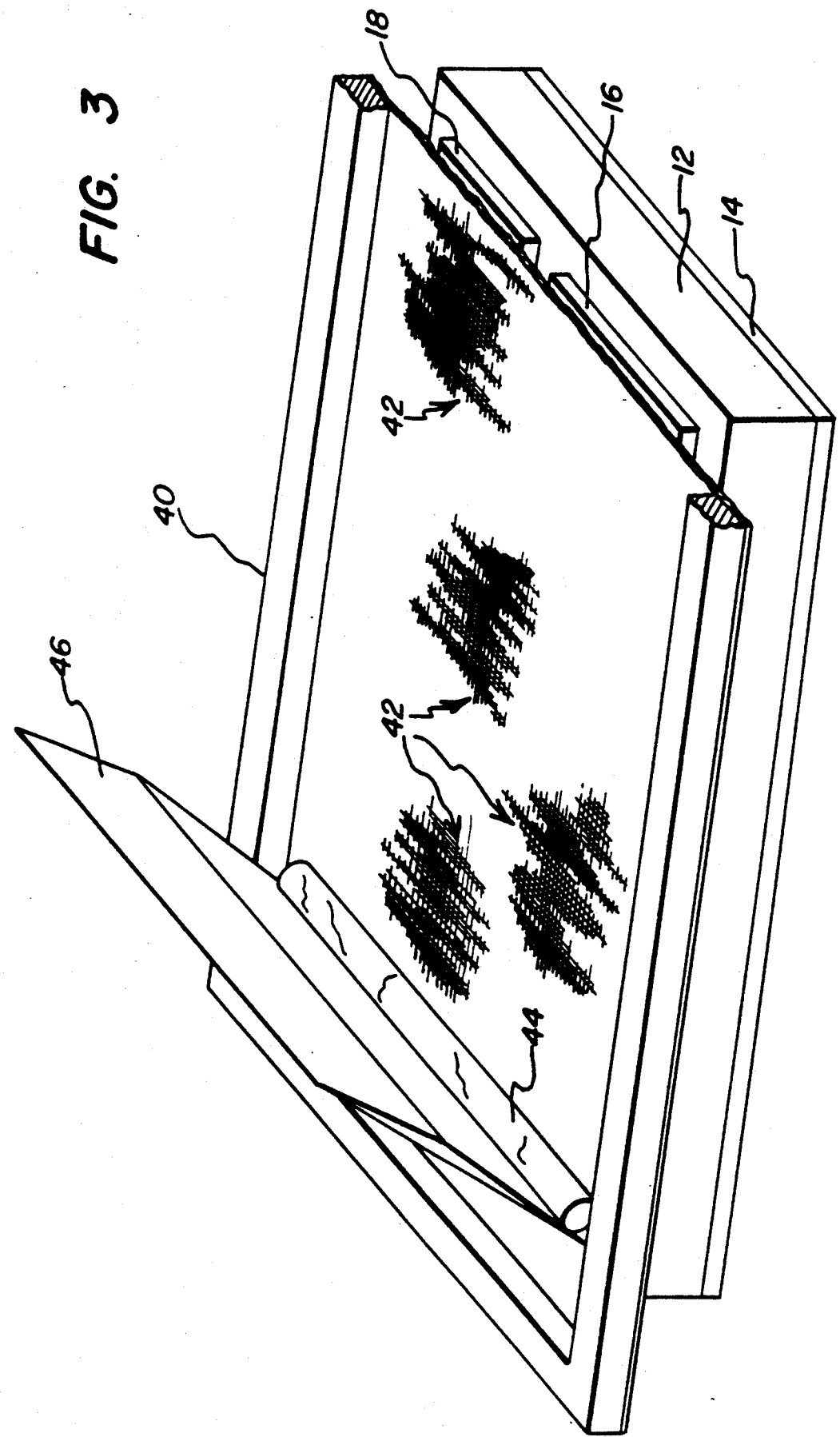
Figure 4:
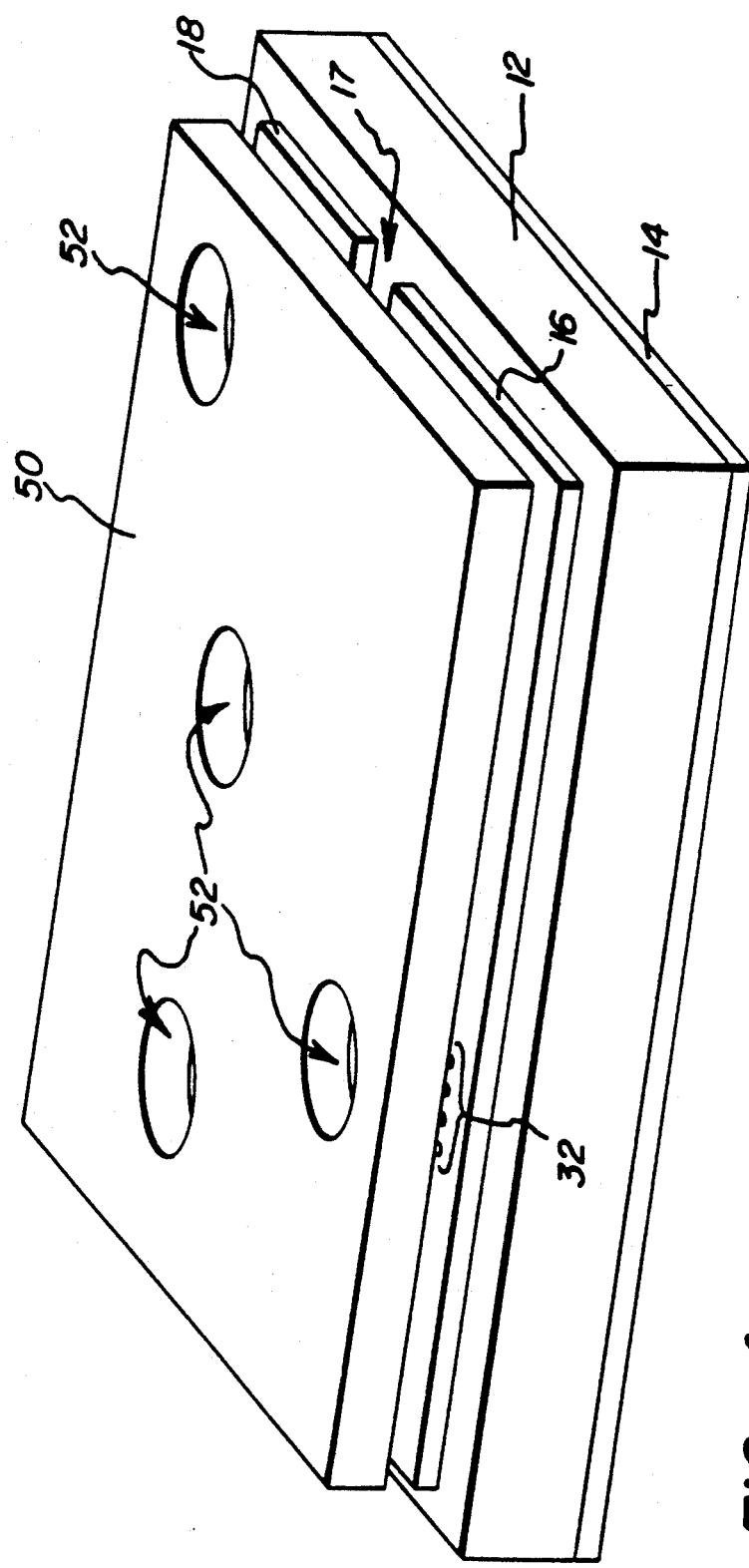

In FIG. 3, the chip 10 is shown with a printing screen 40 disposed thereover. This printing screen is aligned with the arrays 34 and 35 of the bumps 30 with the screen blocked except at the locations 42 of the arrays of bumps to control dispensing of an appropriate amount of solder paste 44 at each of the arrays-of gold bumps as the squeegee 46 moves across the screen. Other means of providing solder on the gold bumps may be employed as desired. These include the use of solder preforms, syringe type applicators and solder already on the conductive pellet and so forth.

Figure 5:
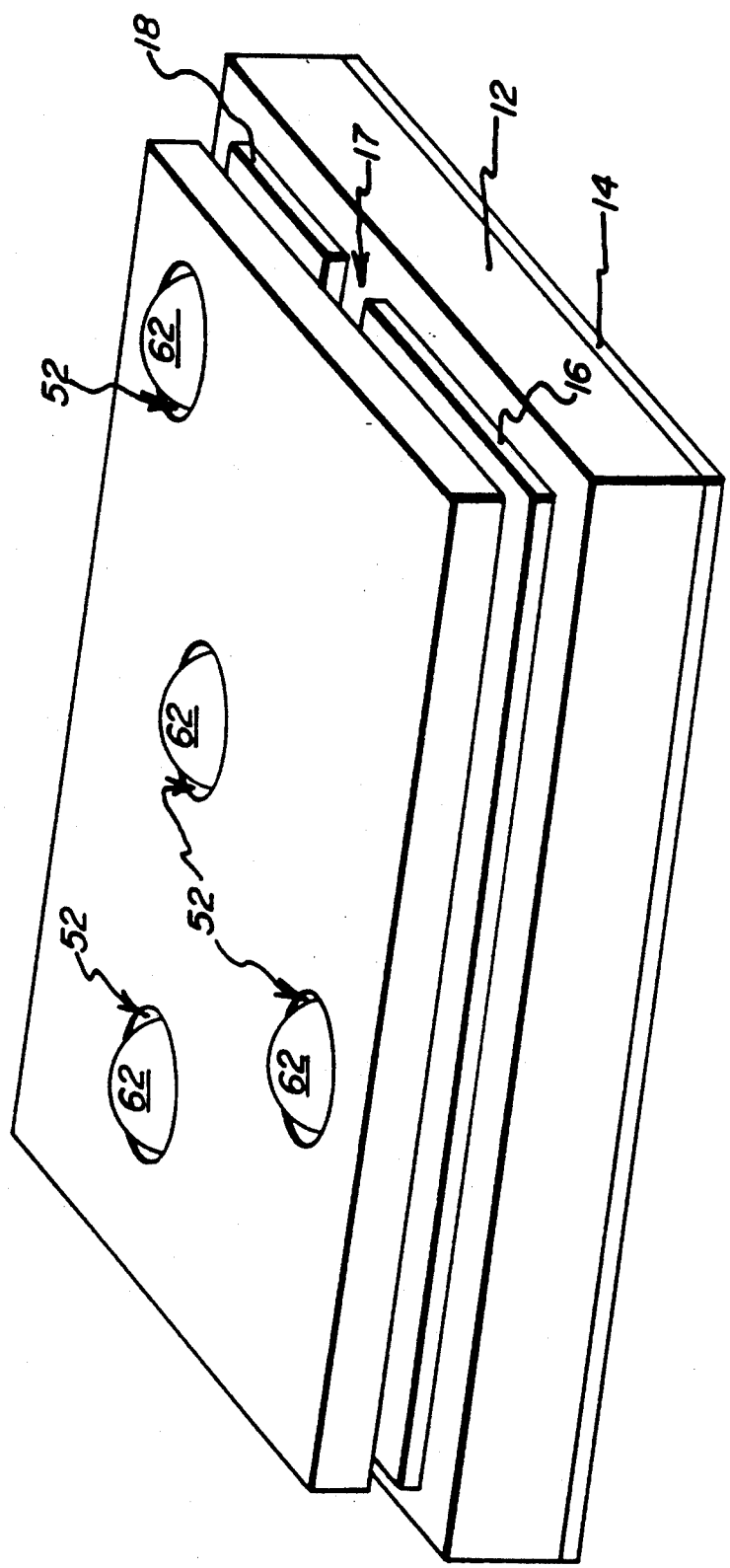

After solder has been dispensed onto the gold bumps 30, a fixture or template 50 (FIG. 4) having apertures 52 therein configured for alignment with the subarrays 31-33 and the array 35 is aligned with the upper surface of the chip 10. This alignment may be visually done, since the subarrays 31-33 and the array 35 are visible through the corresponding apertures 52 which are intended to be aligned therewith. Alternatively, the template may be aligned by a fixture and its alignment checked optically. Thereafter, individual conductive pellets 62 are disposed in the individual apertures 52 as shown in FIG. 5. These conductive pellets are solderable and are preferably copper spheres on the order of 40 (1.01 mm) in diameter.

The template 50 may be metal or ceramic and is held at a position where the maximum width of each pellet is within the aperture in the template or below the template to ensure that removal of the template following soldering does not stress the pellets or their bonds to the contact pads. Where the template is metal, it is preferably non-solderable, especially if solder coated pellets are employed. A ceramic or other low coefficient of thermal expansion template is preferred for large area use, such as for bonding pellets to all of the devices of a wafer at the same time. Use of a silicon wafer as the template with silicon devices assures an absence of thermal expansion mismatch of the template and the wafer. The apertures 52 are preferably smaller in diameter than the apertures in the package lid in which the conductive pellets will eventually be disposed to ensure a minimum of stress on the pellets and their bonds in the final package.

The term "pellet" is used in this specification and the appended claims as a general term for a small body, without limitation as to its explicit geometric shape. Thus, the term "pellet" includes a ball, a sphere, a cylinder, parallelepipeds, irregular shapes and regular geometric solids such as dodecahedrons and so forth. It is preferred to use spheres as the conductive pellets for several reasons. First they provide a smooth surface for bonding to the foil terminals 76 and 78 to be discussed subsequently. Second, being round, they are easy to roll into the holes in a wafersize pellet positioning template and third, they are readily available on the commercial market in a wide variety of diameters. It is not necessary for the conductive pellets to be solid, they may be hollow bodies if desired. However, it is generally preferred that they be solid spheres, both for ease of their own manufacture and to avoid any question of the presence of a contaminating atmosphere within a pellet escaping into the package. It is preferred to have the pellets spheroid in the sense of having a maximum width in a plane through the center of the pellet which is no more than 2 or 3 times the minimum width in a plane through the center of the pellet. For a sphere, this maximum width/minimum width ratio is 1. The pellets also preferably have a thickness which is greater than the thickness of the insulating substrate portion of the lid so that they extend beyond the substrate on both sides of the substrate.

Figure 6:
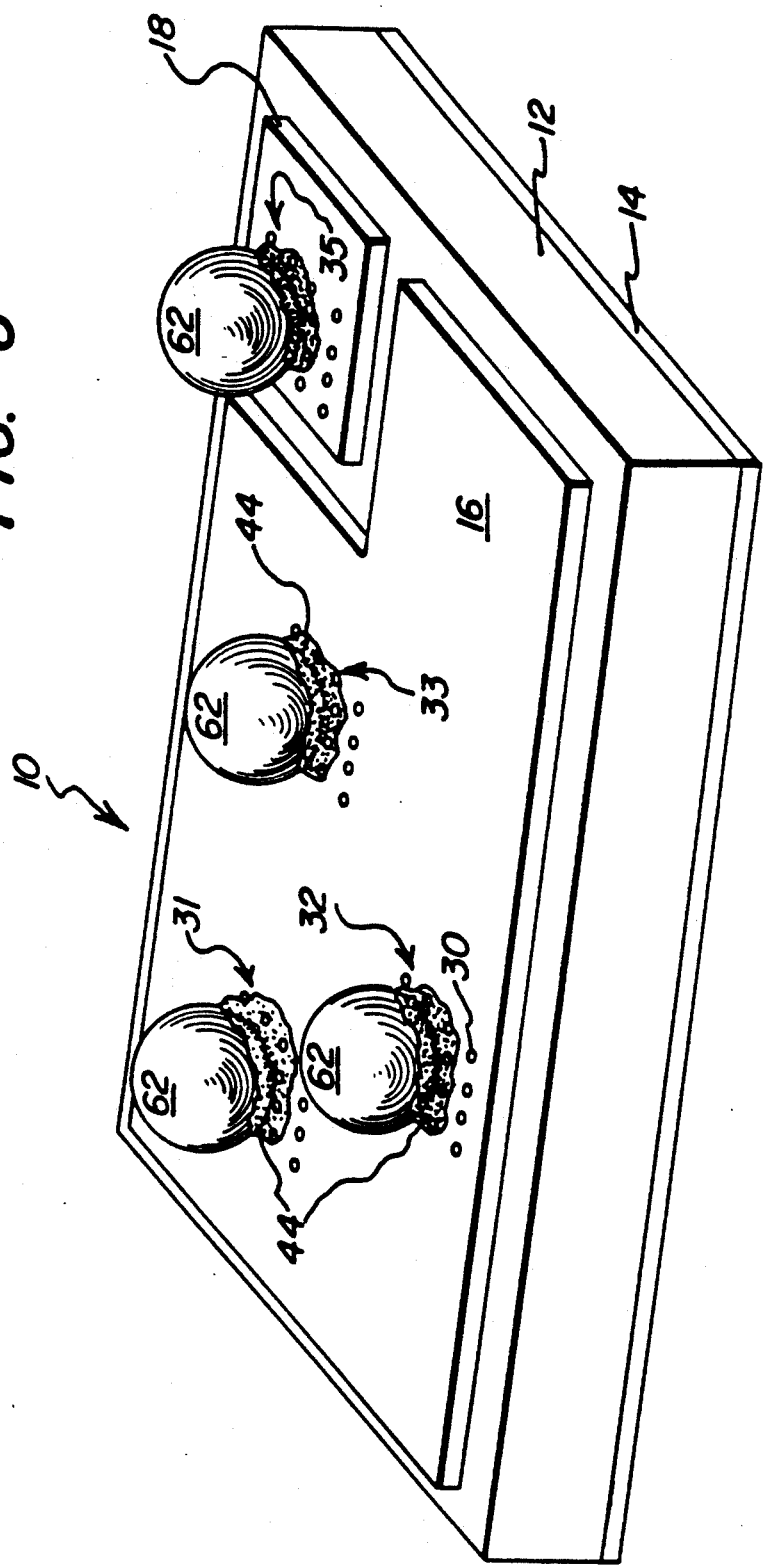
Figure 7:
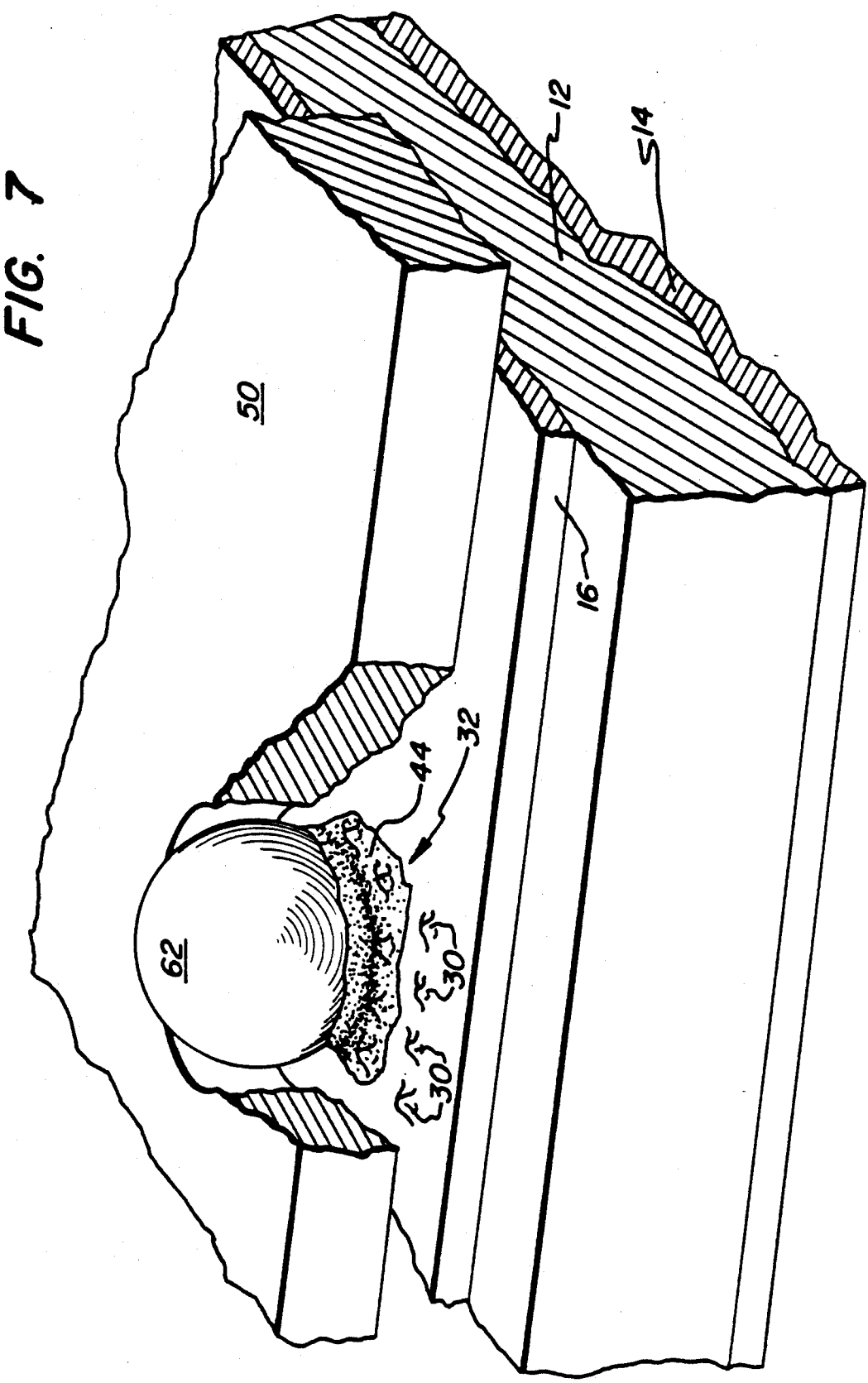

With the chip 10, template 50 and the copper spheres 62 in the position shown in FIG. 5, this structure is heated to the solder melting temperature to melt the solder paste 44. The structure is then allowed to cool to solidify the solder. Thereafter, the template 50 is lifted from the chip 10 and the chip 10 appears as illustrated in FIG. 6 where each of the copper spheres is soldered to the corresponding subarray or array of conductive bumps. The bonding of a copper sphere 62 to a subarray 32 of the gold bumps is illustrated in an enlarged detail in FIG. 7, prior to removal of the template 50 which is shown cut away. The template 50 ensures that the sphere 62 remains in alignment with the subarray 32 until after solidification of the solder. After solidification, the solder holds the sphere in place. As can be seen, a fillet of solder 44 extends from part way up the copper sphere downward and outward onto those individual gold bumps 30 which are sufficiently close to the sphere to enable the quantity of solder present to bridge the gap, if any, between the copper sphere and that gold bump. It is preferred to provide sufficient solder to ensure the formation of a strong solder fillet which firmly secures the sphere to the contact pad. The gold bumps which are spaced from the solder fillet which is attached to the sphere may or may not be solder coated depending on the quantity of solder present and the manner of its deposition. These isolated gold bumps may be omitted if the template has tight enough tolerances and can be aligned with sufficient accuracy, however, their presence is preferred at this time because they add redundancy which makes the template alignment accuracy less critical.

Figure 8:
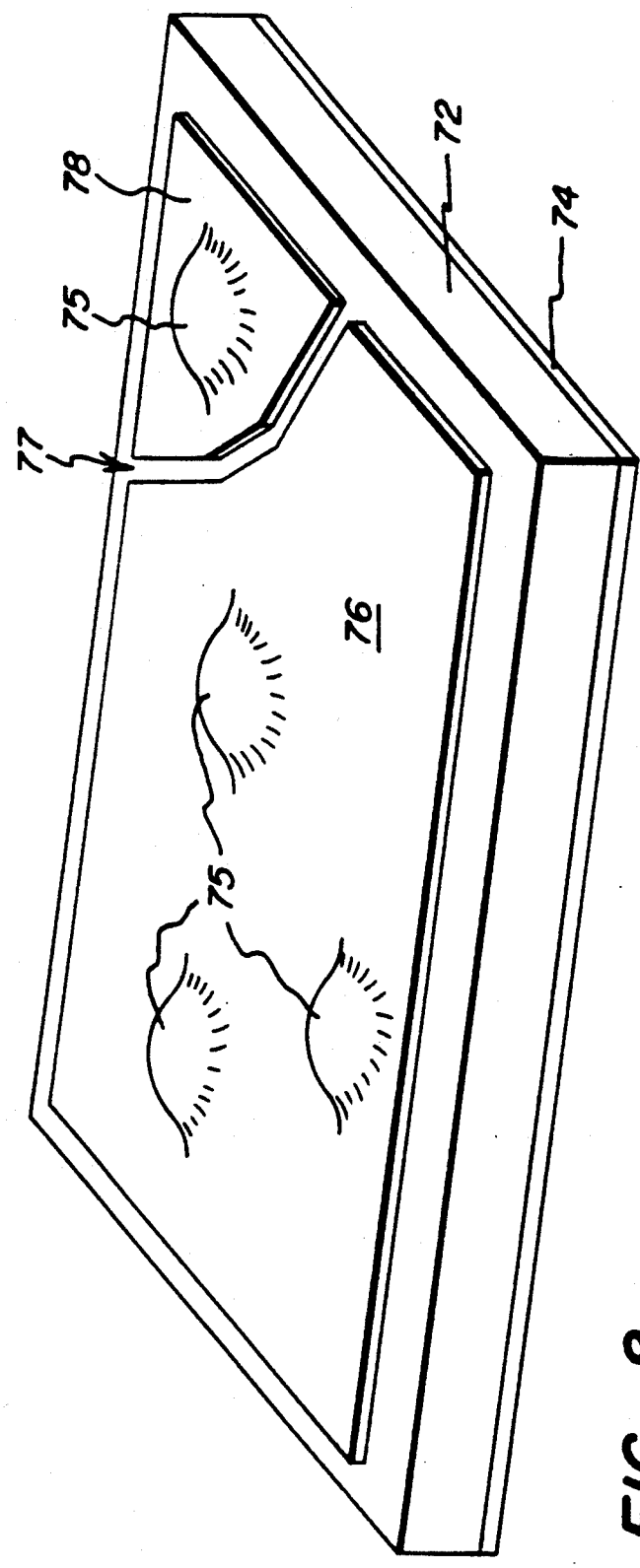
Figure 9:
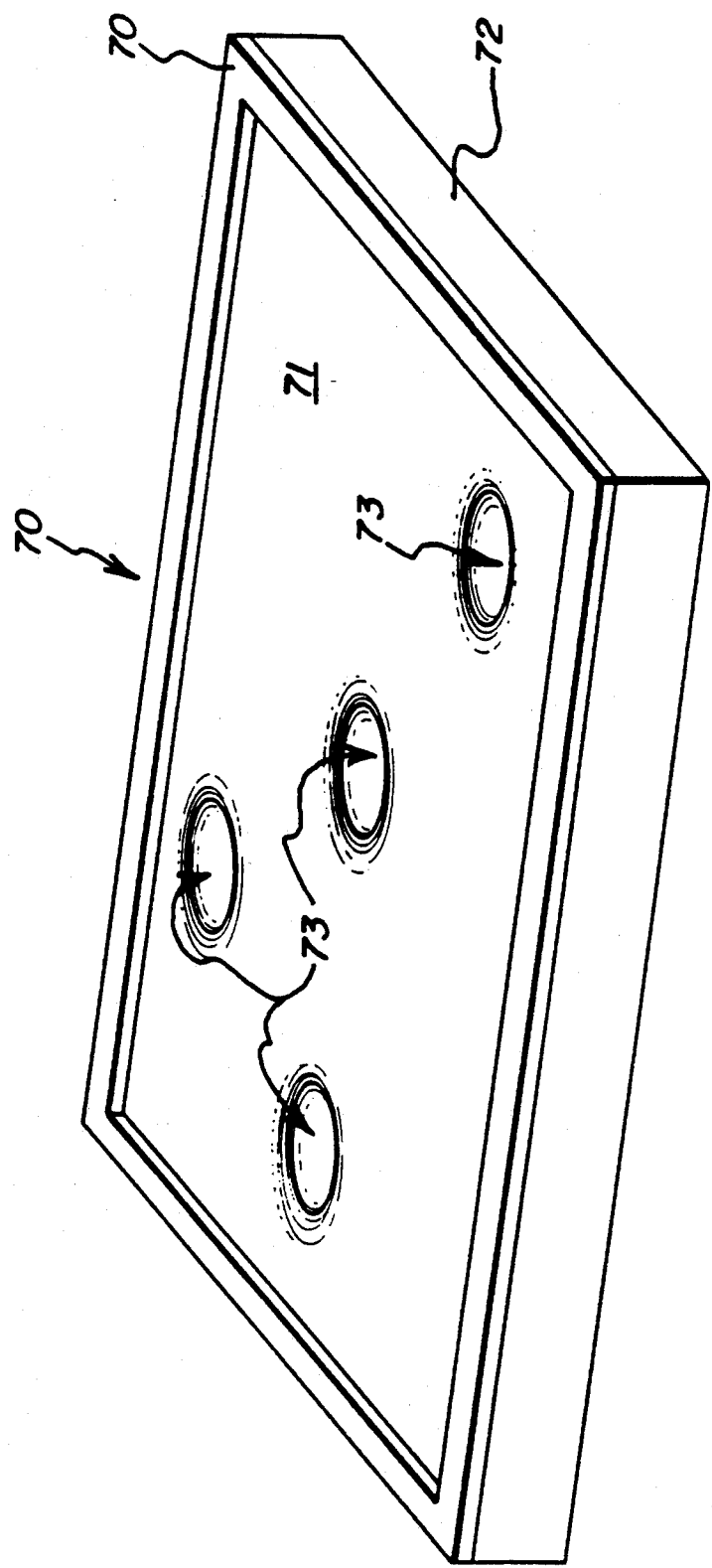

A package lid 70 is illustrated with its outer surface up in FIG. 8 and its inner surface up in FIG. 9. The cover 70 comprises a ceramic plate or substrate 72 which may preferably be alumina, but may also be beryllia or aluminum nitride or other appropriate electrically insulating materials for forming a hermetically sealed package. If desired, the lid could even be metallic with appropriate electrical insulation isolating the separate terminals. This ceramic plate may preferably be about 25 mils (0.64 mm) thick. On the upper surface of the plate 72, two pieces of copper foil 76 and 78 are direct bonded to the ceramic 72 to form separate power and control terminals 76 and 78, respectively. The power terminal 76 is spaced from the control terminal 78 by a gap 77 in which no conductive foil is present. The terminals 76 and 78 are preferably copper foil on the order of 1-25 mils (0.025-0.63 mm) thick which has been direct bonded to the ceramic substrate 72 by the direct bond copper process described in U.S. Pat. No. 3,744,120 to Burgess et al., U.S. Pat. No. 3,766,634 to Babcock et al, U.S. Pat. Nos. 3,854,892 and 3,911,553 to Burgess et al. and U.S. Pat. Nos. 3,994,430 and 4,129,243 to Cusano et al. Each of these patents is incorporated herein by reference. Alternatively, the copper foil could be brazed to the ceramic using the molybdenum manganese process, for instance. The only limitation on the process used to bond the foil to the ceramic being that a hermetic seal must be produced for a hermetic package. It is preferred for reasons discussed hereinafter that the foil terminals 76 and 78 be flexible where they extend across the apertures in the lid.

In order for the package 90 to be hermetically sealed, the conductive foils 76 and 78 must provide a hermetic seal enclosing the apertures 73 within the package. For this purpose, it is preferred to have each of the apertures positioned 100 mils or more from the nearest edge of the foil terminal which covers it. This is because we have found that in direct bonding copper to alumina plates, a direct bond distance of 100 mils essentially ensures the provision of a hermetic seal every time. As the length of the shortest path from the aperture to the edge of the foil terminal decreases, the yield percentage of hermetically sealed lids decreases. Consequently, the 100 mils distance is not a hard and fast limit, but is a desirable one where the package configuration permits its use since it makes pretesting of lids for hermetic seals unnecessary. This distance may be shortened where necessary, with an attendant yield loss or, if improved methods of direct bonding are developed, may be shortened as the path length needed to ensure a hermetic seal decreases. While in this embodiment the hermetic seal is provided by the foil which forms the outside of the package at that location, that seal may be provided anyplace between the chip and the outside surface of the package, including within the aperture or inside the package.

A peripheral frame 74 of solderable metallization is disposed on the surface 71 of the plate 72 which will be oriented inward when the package is finally assembled. The frame 74 is also preferably direct bonded copper. In the FIG. 9 view of the lid 70, four apertures 73 are visible. These apertures are preferably circular and are distributed in the same spatial relationships to each other as the apertures in the template 50 which was used to control the position of the copper spheres 62 for soldering to the semiconductor device 10. As illustrated in FIG. 8, the foil electrodes 76 and 78 are dimpled outward over each of the apertures 73 with the dimples being identified by the reference numeral 75. When the lid 70 is placed over the chip 10, each of the spheres will fit within one of the apertures 73 and make contact to the foil electrode thereover at the dimple 75.

While in the illustrated embodiment, each of the apertures 73 in the ceramic plate 72 contains a conductive pellet in the final package, apertures may be included which do not contain a conductive pellet without an adverse effect on the package so long as the aperture is hermetically sealed by the conductive foil thereover. Apertures may be left vacant for any of several reasons. First, a universal lid configuration may be used for more than one device type and provided with an aperture or apertures which are used with only some of the devices and left vacant with others. Second, where the chip being packaged contains a plurality of devices, a defective device may be left unconnected by not bonding conductive pellets to its contact pads. This leaves the apertures associated with that device vacant.

Figure 10:
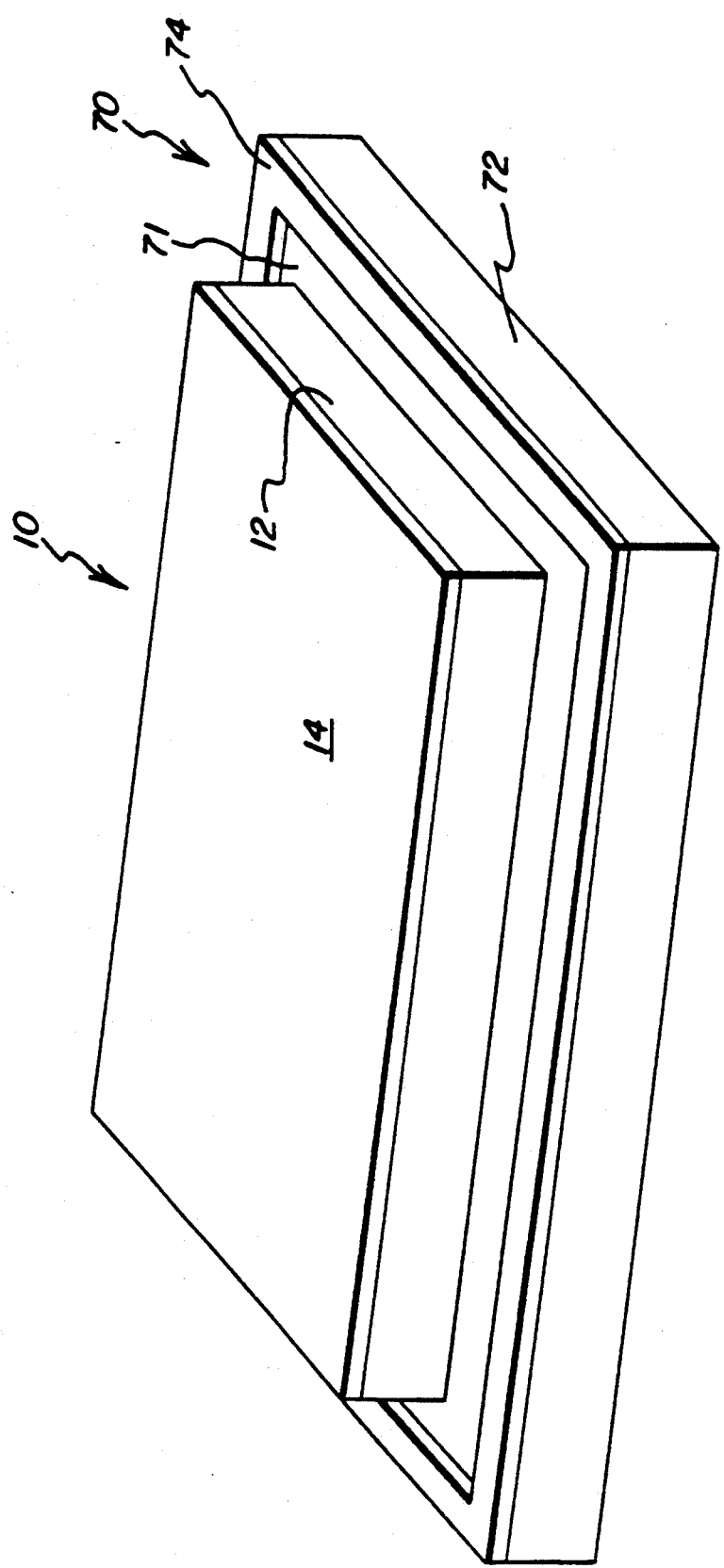

In FIG. 10, the lid 70 is illustrated in the same orientation as it is in FIG. 9 and the chip 10 has been inverted from its orientation shown in FIG. 6 and aligned with the lid 70 so that each of the copper spheres 62 is disposed in the corresponding aperture 73 in the lid 72. Prior to placing the chip 10 in the lid 70, a small quantity of solder is disposed in each of the apertures 73. With the structure in the configuration illustrated in FIG. 10, the structure is heated to the melting point of the solder and then cooled to solder each of the conductive pellets to the foil terminals at the dimples 75. At the end of this step, the lid and chip are a single bonded structure held together by the bonds between the copper spheres and the conductive bumps 30 on the chip and between the copper spheres and the foil terminals 76 and 78.

A base for the package is illustrated generally at 80 in FIG. 11. This base comprises a copper plate 82 which may preferably be 10-20 mils thick for rapidly spreading heat generated by the packaged device during use. At one end of this plate, a frame 84 of copper has been direct bonded to the plate 82 in accordance with the teachings of the above-referenced patents. Many alternative processes can be used including soldering, brazing and die shaping the base plate 82. The frame 84 is a mate for the frame 74 on the inner surface of lid 70. A thin solder layer 86 is disposed on the upper surface of the frame 84. The thickness of the frame 84 is selected to provide a cavity 85 therein which is of appropriate height for containing the semiconductor chip 10 when the package is in its sealed configuration. Typical die (chips) use a frame 84 which is 18 mils (0.46 mm) thick (high). Within the cavity 85, a central coating 88 of solder is provided. This solder is restricted to the area where the metallization 14 of the chip will be disposed in the final package configuration.

The surface of the frame 74 on the lid 70 which is oriented upward in the FIG. 10 illustration should also have a solder layer disposed thereon. All of the parts are now cleaned to remove any remnants of the solder flux which is used to aid in solder adherence to the copper. The chip/lid combination illustrated in FIG. 10 is then inverted and placed on top of the frame 84 of the base 80 in an appropriate atmosphere such as dry nitrogen. With the lid frame 74 aligned with the base frame 84 with the terminal extensions 96 and 98 held in place, as shown in FIG. 12, the structure is heated to the melting point of the solder to seal the frame 74 to the frame 84 to thereby provide a hermetically sealed package 90 containing the semiconductor device while simultaneously bonding (1) the chip via its back metallization 14 to the base 18 with solder 88 and (2) the wide, flat external terminal extensions 96 and 98 to foil terminals 76 and 78, respectively, in order to provide easily connected terminals. The package is then cooled to solidify the solder. The power terminal's extension 96 may preferably be 10 mils (0.025 mm) thick by 300 mils (7.6 mm) wide while the control terminal extension 98 may preferably be 10 mils (0.25 mm) thick by 100 mils (2.5 mm) wide. The bodies of these terminal extensions are preferably bent upward away from the chip relative to the soldered-down portion thereof in order to maintain an appropriate gap between them and the lid frame 74 for voltage breakdown purposes. Alternatively, these terminal extensions may be bent to extend vertically away from the lid. The portion of the base 82 which extends beyond the frame 84 serves as the second power terminal 94 of the package. If desired, each of the terminals 94, 96 and 98 may be bent upward to provide a package having three terminals which may be plugged into a socket or soldered into a printed wiring board. Alternatively, just the terminals 96 and 98 may be bent upward in order to provide easy access to those terminals after mounting of the package. The terminal 94 may have a hole or holes therein to assist in mounting the package in its final use configuration. Further, if desired, the frame 84, rather than being disposed at one end of the base plate 82, may be more centrally located with external extensions or terminals 94 of the plate 82 extending in both directions from the chip-containing portion of the package. As a further alternative, where a more compact package is desired, the terminal extension 94 may be omitted and the base made the same size as the lid. Such a package may preferably be soldered to a heat sink or other circuit conductor. As an alternative to soldering the terminal extensions 96 and 98 to the foil terminals 76 and 78, respectively, these terminal extensions may be direct bonded to the foil terminals at the same time that the foil terminals are direct bonded to the ceramic substrate 72.

As is most clearly seen in the cross-section view in FIG. 13, each of the conductive pellets 62 is preferably spaced from the wall of the aperture in which it is disposed in order to provide compliance both during package assembly and during temperature cycling of the completed device package. The foil terminal 76 or 78 is sufficiently flexible where it extends across an aperture in the ceramic substrate 72, that it flexes in response to movement of the pellet, thereby minimizing or eliminating stresses which would otherwise be induced by differences in thermal expansion or contraction of the chip, pellet, substrate and foil terminals. The spacing of the pellet from the aperture wall enables compliant relative movement of the foil, pellet and chip relative to the ceramic portion of the lid.

It is preferred to use a single temperature solder throughout the fabrication process for this package in order that only the highest temperature solder will be consumed in the packaging process with the result that lower temperature solders may be used in bonding the package and its leads into the structure in which the device is used without fear of melting solder within the package.

When each of the solders used in fabricating this package has the same melting point, the solder bonding the copper balls to the conductive bumps is melted thrice, the solder bonding the balls to the foil electrodes is melted twice and the solders sealing the frames together and the chip to the base and the external terminals 96 and 98 to the foil terminals is melted once during fabrication.

During the sealing of the package when all of the solder therein is molten, the self-aligning effects of the surface tension of the solder 88 between the chip metallization 14 and the base plate 82 of the package tends to self-align the chip with respect to the solder pad 88. In the same manner, the molten solder 86 tends to self-align the lid 70 with respect to the frame 84 of the base. These effects do not result in disalignment of the copper spheres from the arrays of conductive bumps 30 because the arrays of bumps on the chip are positioned accurately on the chip with respect to the self-aligned positions of the chip and lid relative to each other in the final packaged configuration.

It is also possible to assemble this package in a variety of other sequences, for example, by first bonding the chip 10 to the base 80, bonding the copper balls to the lid, placing the lid over the chip and then bonding the lid to the base and the copper balls to the chip at the same time. Where the conductive pellets are bonded to the lid before being bonded to the chip, the pellets may preferably be directly bonded to the foil of the lid. Where a copper pellet is direct bonded to a copper foil, we consider that pellet to be integral with that foil, since the copper/oxygen eutectic which forms the bond is thin and does not adversely affect the electrical conductivity of the structure. However, we prefer the fabrication sequence described in detail above because it provides visual alignment of the copper balls with the chip, thereby ensuring proper connection of the contact pads on the chip to the terminals on the package, whereas the alternative sequence makes alignment of the lid with the chip a blind operation, thus requiring more alignment accuracy.

The accurate self-alignment discussed above may be employed as a means of assuring proper alignment of the spheres with the arrays of bumps when the package is assembled in the alternate sequence of bonding the chip to the base alone, the spheres first to the lid and then to the chip while sealing the package. Alternatively, the entire package can be assembled without any solder reflow and all of the solder bonds formed in a single solder reflow step, if desired. However, those alternative processes are still not preferred because they do not enable visual inspection of the bond between the ball and the conductive bumps.

Those skilled in the art will recognize that there are tolerances present in this package with respect to the thickness of the frame 84, the thickness of the ceramic plate 2 of the lid, the thickness of the solder layer 86 which bonds the lid to the base, the thickness of the solder layer 88 within the base cavity 85, the thickness of the chip and the diameter of the spheres. The problems associated with these types of tolerances on thicknesses are one of the things which has prevented previous hermetic packages from having the leads come out of the lid vertically as is done in this package. In this package, all of these tolerances are accommodated by the dimples 75 in the foil terminals 76 and 78.

The lid 70, as illustrated in FIG. 8, preferably has the dimples 75 dimpled to about 80% of the final nominal dimple height. In this way, when the tolerances combine to increase the height of the cavity 85 relative to the thickness of the semiconductor chip, only a little bit of additional dimpling takes place when the lid is positioned in place, whereas when the tolerances are nominal, an additional 20% dimpling takes place to bring the dimples to their full height, and when the tolerances combine to produce a cavity height which is short relative to the chip, overdimpling occurs to accommodate that difference. In this manner, the configuration of this package and its assembly ensure a vertical interference fit during assembly which ensures good contact between the two components involved at each bond, that is between the chip bottom and the base 80, between each of the upper surface contact pads of the chip and the spheres and between the spheres and the foil terminals 76 and 78. The dimples also provide pliability for stress relief during device operation or other temperature cycling of the packaged device.

Even with the chip overly thick for the packaged cavity, the top of the chip is still spaced somewhat from the inner surface 71 of the lid 70. At the final sealing step, all of the solder reflows, thereby relieving stresses within the package without lateral movement of the chip.

The process described above has been in terms of the metallization of contact pads 16 and 18 being nonsolderable. The process and package are equally effective with solderable metallizations on pads 16 and 18. With solderable metallization, the use of the gold conductive bumps becomes optional and the conductive pellets may be soldered directly to the contact pad metallization (as well as to the gold bumps if they are present). With solderable contact pads, it is important to ensure that sufficient solder is present to provide a sound bond between the conductive pellet and the contact pad with a meniscus or fillet which provides sufficient bond cross-sectional area, since the areas of the contact pad away from the conductive pellet will also attract the solder.

While the fabrication sequence has been shown for a single individual chip at each step of the process, it is considered preferable for production speed and economy to bond the conductive gold bumps to the contact pads 16 and 18 while the chips are still in wafer form, to apply the solder to the wafer and to provide a template for positioning the copper balls on the wafer for bonding to the individual chips. With such a full-wafer template in place, the copper balls are most easily inserted in the apertures in the template by placing a quantity of balls on top of the template and vibrating or otherwise moving the template in a manner to cause a ball to roll into each of the apertures. Thereafter, the entire wafer is heated to above the melting point of the solder and cooled to bond the individual copper balls to the corresponding arrays of gold bumps. Thereafter, the wafer may be diced into individual chips which are then ready for insertion into lids 70. In a similar manner, the lids 70 may preferably be produced in quantity as snap substrates and have the foil electrodes 76 and 78 direct bonded to the individual plates 72 of the snap substrate prior to separation of that snap substrate into individual lids. The frames 74 are preferably similarly bonded to the individual plates 72 prior to separation of the snap substrate into individual lids 70.

The pre-dimpling of the foil terminals 76 and 78 is preferably done at the snap substrate stage of the process using copper spheres which have been bonded to a dimpling plate in a configuration to align with the apertures in the snap substrate. This dimpling plate is then placed on the snap substrate which is supported in a manner to allow the dimples to be protruded from its lower surface and the dimpling plate is gently pushed down on the snap substrate to create the 80% pre-dimple.

Figure 14:
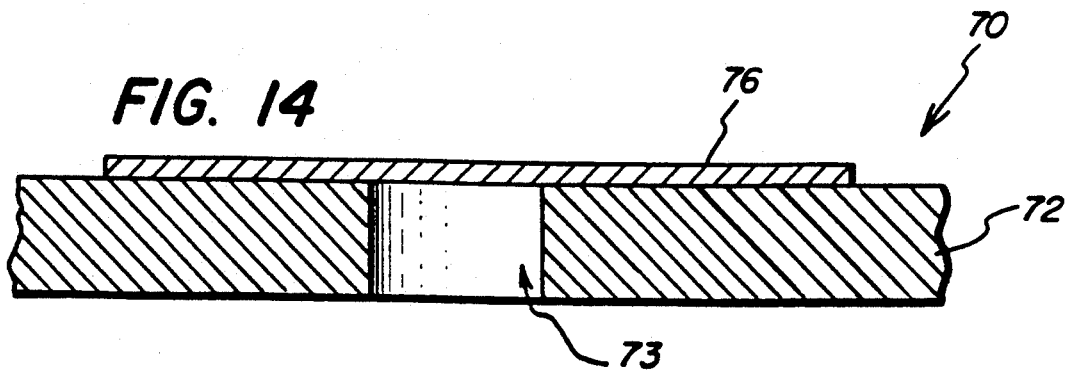
FIGS. 14-17 are detailed illustrations of the apertures in the lid and conductive foil thereacross.

FIG. 14 illustrates a cross-section through a portion of a lid 70 in the vicinity of one of the apertures 73 therein. In this cross-section, the foil terminal 76 has not been dimpled. The lid may be used in this configuration if desired.

Figure 15:
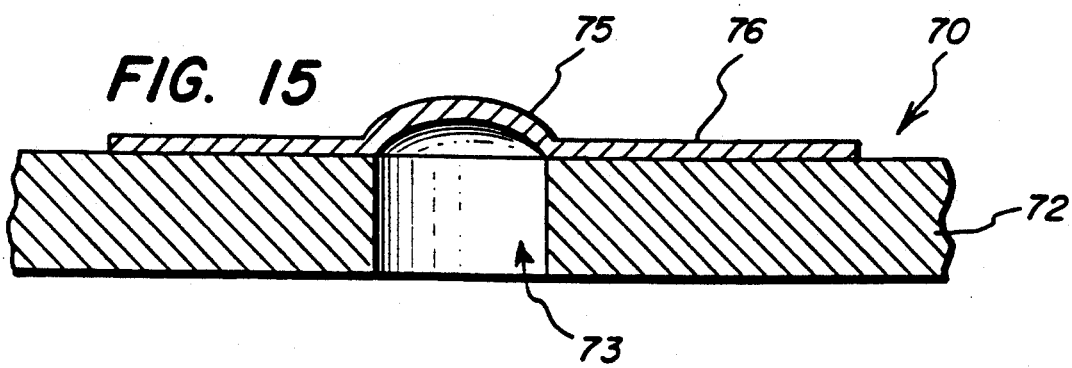

FIG. 15 is a similar cross-section of a portion of a lid except that the foil electrode 76 has been dimpled outward in the manner which has been discussed above.

Figure 16:
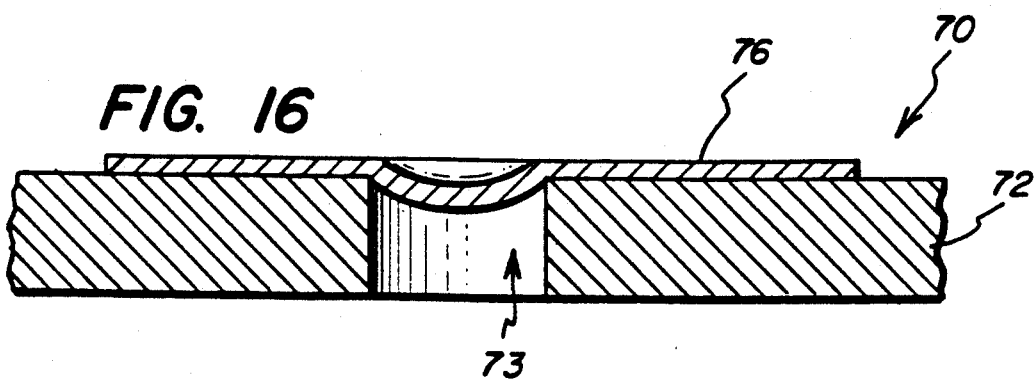

FIG. 16 is a similar cross-section through a portion of a lid 70 except that the foil 76 has been dimpled inward into the aperture 73 rather than outward away from it. Any of these dimple configurations may be employed successfully in a package of the inventive type provided the overall package height is adjusted accordingly. However, the outward dimple is preferred because the inner surface of the foil 76 then provides a better match to the surface of the conductive pellet disposed within that aperture.

Figure 17:
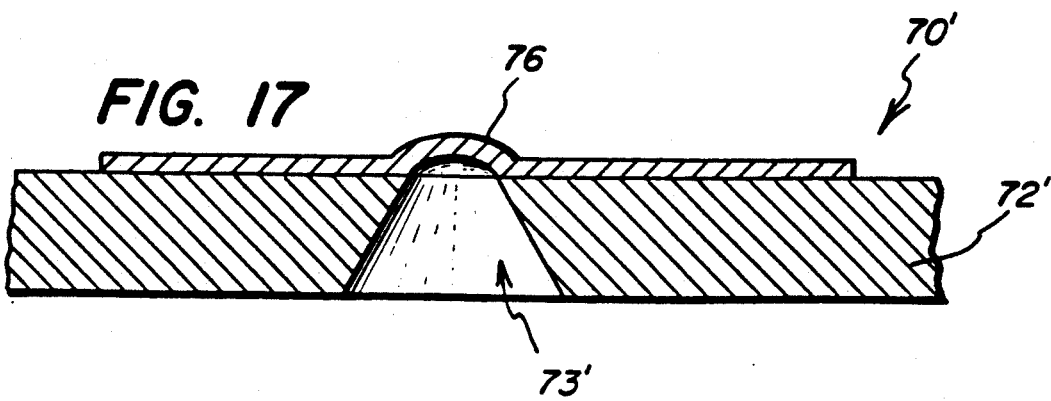

FIG. 17 illustrates a cross-section through a lid 70' in the vicinity of an aperture. However, in this lid 70', the aperture 73' in plate 72' has a conical configuration rather than a cylindrical configuration. This can assist in positioning copper spheres therein, especially if the package is assembled by bonding the chip first to the base of the package. The conical aperture 73' may be made small enough at the upper surface in FIG. 17 that the conductive spheres 62 cannot pass therethrough.

Figure 18:
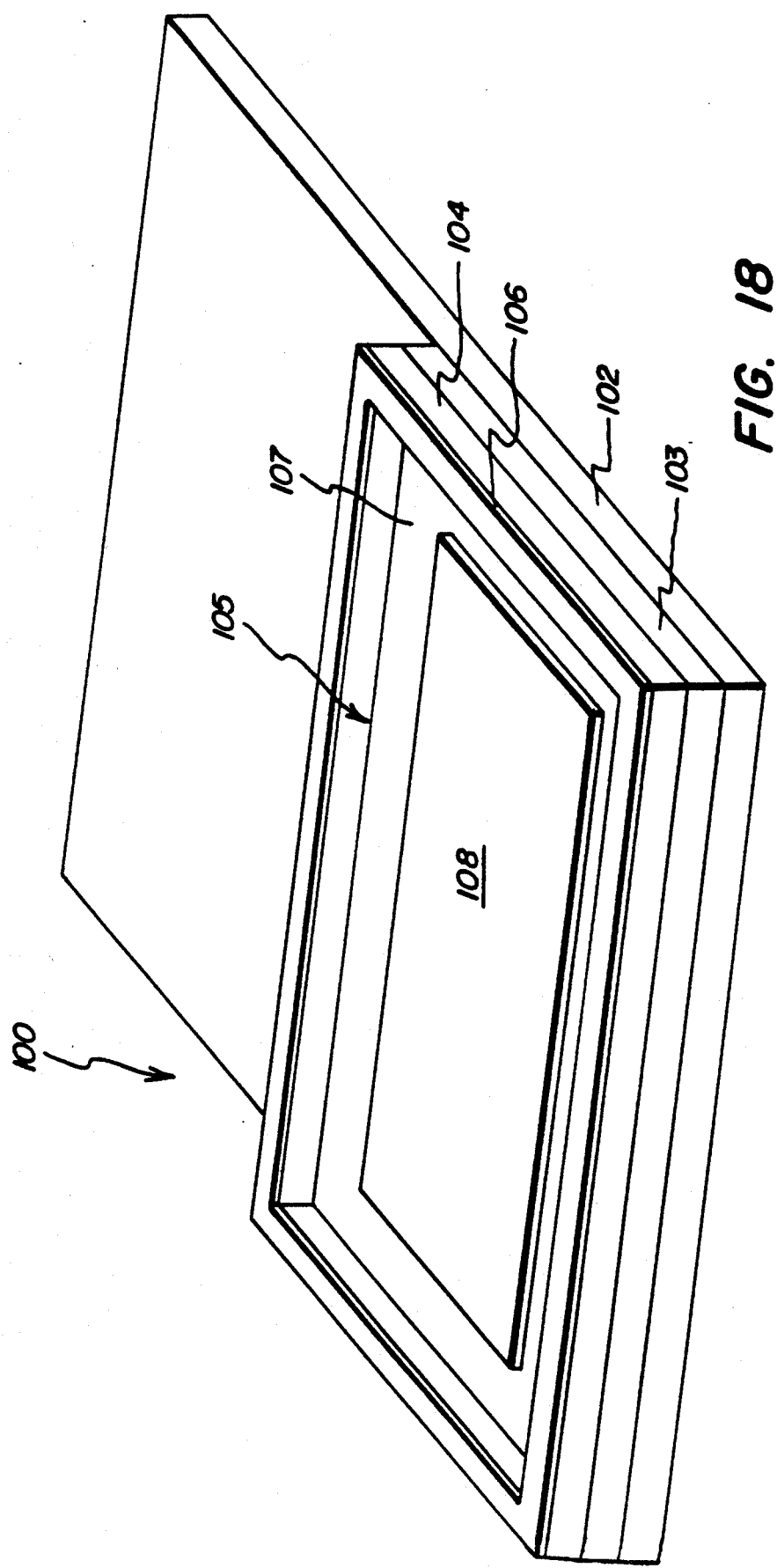
FIGS. 18 and 19 illustrate two alternative isolated versions of a base for the package.

In the package illustrated in FIGS. 1-13, the base plate 82 of the package is directly electrically connected to the back of the semiconductor chip. This is desirable where the lower surface of the chip comprises a power contact of the device. However, there are other devices in which it is desirable to isolate the base of the package from the bottom of the semiconductor chip. A package base 100 illustrated in FIG. 18 provides this isolation. This package base is similar to the package base 80 except for the presence of a ceramic plate 103 disposed between the base plate 102 and the copper frame 104. A layer of solder is shown on top of frame 104. Ceramic plate 103 forms the bottom surface 107 of the cavity 105. The ceramic plate 103 is preferably direct bonded to the copper base plate 102 and to the copper frame 104 and in addition to a chip hold down pad 108 which has the shape and configuration of the bottom of the semiconductor chip. The chip is then soldered to the plate 108 in a manner similar to that which has been described in connection with FIGS. 1-13.

Figure 19:
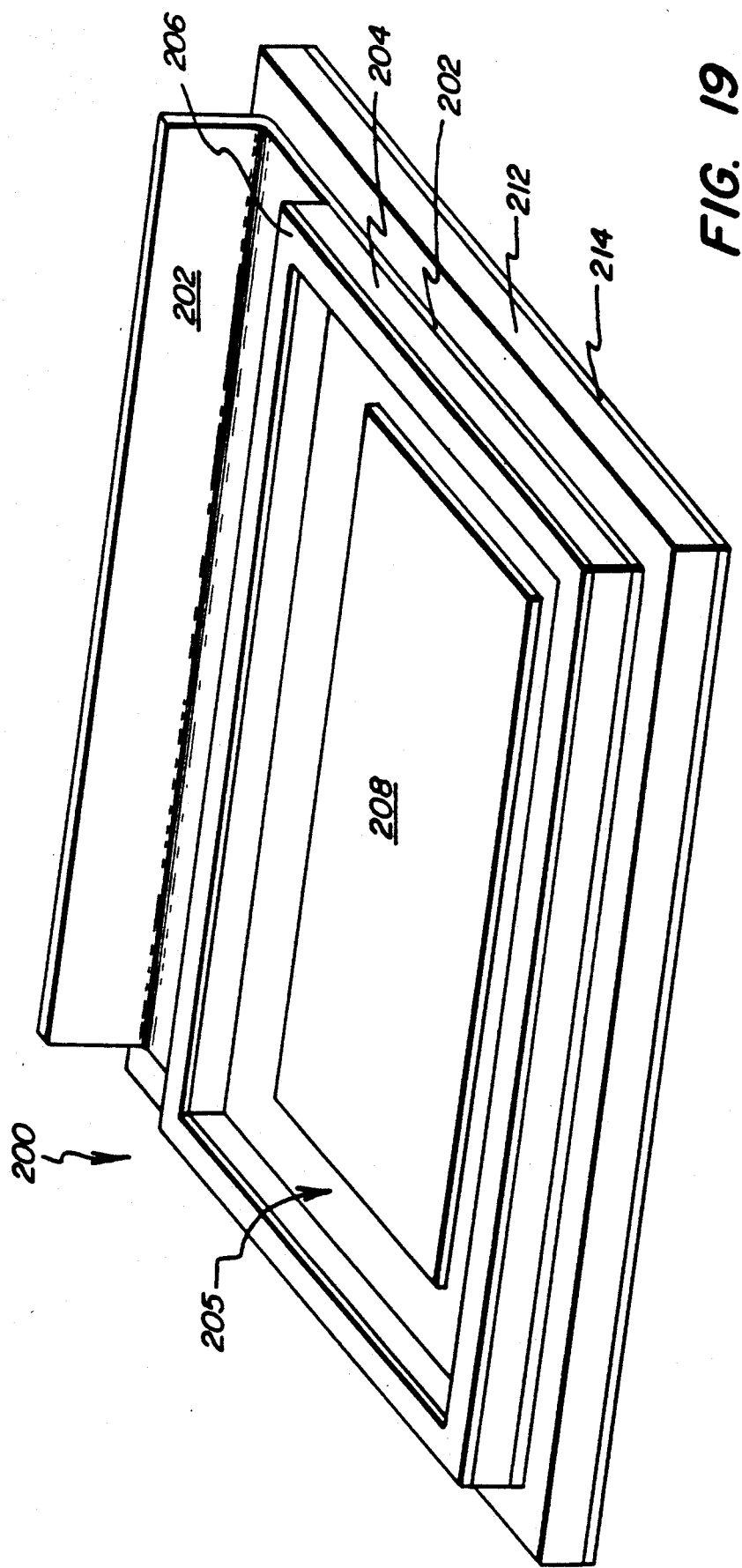

In FIG. 19, an alternative isolated package base is illustrated in which the bottom of the chip is still a power contact, but that contact is isolated from the bottom of the package. The frame 204 and solder 206 are similar to those in base 100. The base layer 202 of copper extends outward beyond frame 204 and is bent upward. A solder layer is disposed on base layer 202 within the cavity 205 for bonding the chip to the base layer. The base layer is direct bonded to insulating plate 212 which may preferably be beryllium oxide (BeO). A layer of direct bonded copper 214 on the lower surface of insulating plate 212 allows the package to be soldered to a heat sink. The insulating plate is made larger than base layer 202 and frame 204 to provide a longer voltage breakdown path between base layer and metal layer 214 than would be provided by the thickness of insulating plate 212 by itself.

Figure 20:
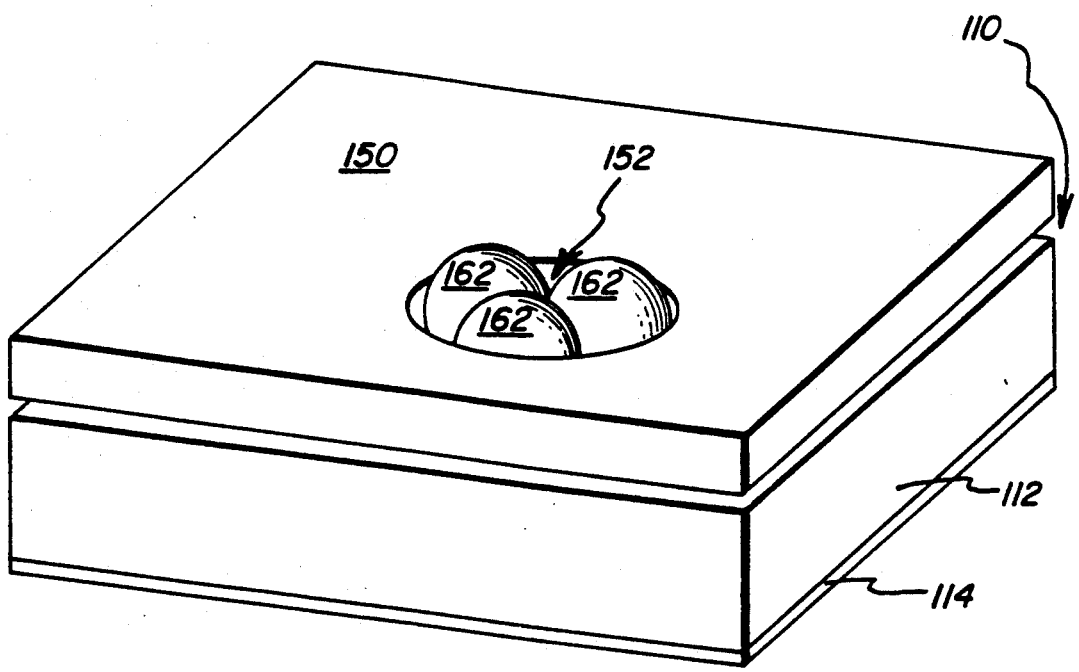
FIG. 20 illustrates an alternative pattern of conductive pellet placement.

In FIG. 20, an alternative method of positioning the conductive pellets is illustrated. In FIG. 20, a semiconductor device 110 comprises a semiconductor body 112 having a back metallization 114 and a contact pad (not shown) on its upper surface. A template for positioning the conductive spheres is positioned over this device. The template 150 has an aperture 152 therein which is suitable for containing three conductive spheres 162 of the size being used. A corresponding aperture is provided in the lid for packaging this device. The copper foil terminal which extends across this aperture will contact each of the three spheres 162. This alternative configuration is not preferred for several reasons. First, the spheres are close enough together that they do not have a substantial effect on the lateral current in the contact metallization on the upper surface of the chip. Second, the exact location of the spheres is less certain than where each sphere is disposed within an individual aperture and third, if they are touching each other or the insulating plate 72 of the lid, they can reduce the lateral stress relief which is provided by a single sphere within an aperture where that sphere is spaced from the wall of the aperture.

The above discussion of the process of fabricating the package shown in FIGS. 12 and 13 has been in terms of each of the connections within the package being bonded with solder. Alternatively, some or all of these connections may be solderless bonded. As used in this specification and the appended claims, "solderless bond or solderless bonded" means without solder, i.e. a direct bond. Thus, solderless bonded includes thermocompression bonded, ultrasonically bonded, thermosonically bonded, defusion bonded, direct bond copper and any other similar bonding process. The term "direct bonded" is used to refer to the direct bond copper process described in the patents listed above.

Preferably, for solderless bonding, each of the connections may be formed by thermocompression bonding. In order to thermocompression bond the entire package, it is preferable that each of the conductive components where bonding is to take place has a gold flash thereon to facilitate the thermocompression bonding. However, other surfaces may be employed in accordance with well known considerations in thermocompression bonding. In thermocompression bonding this package, the bonding sequence illustrated in FIGS. 1-12 is still preferred, but with the step of applying solder omitted. Accordingly, the conductive gold bumps are preferably provided on the contact pads, although the process can succeed without the presence of the gold bumps. The copper balls are also provided with a gold flash. The balls are then thermocompression bonded to the gold bumps on the contact pads in the positions illustrated in FIG. 6. Thereafter, the chip is turned upside down in the lid and the balls are thermocompression bonded to the inside surface of the foil electrodes 76 and 78 in a similar manner. Thereafter, this combined structure is placed on the base and thermocompression bonded to the base. Thermocompression bonding at this stage is made possible despite the hermetic nature of the package and the absence of wire bonds internal to the package because of the compliance provided by the dimples 75. Enough pressure can be exerted on the chip 10 via the dimples 75 and the balls 62 to provide a sufficient contact area between the back of the chip and the base of the package to form a good thermocompression bond between the chip and the package base. Pressure on the lid aids thermocompression bonding of the frame 74 of the lid to the frame 84 of the base. Of the bonds involved in thermocompression bonding this package, the seal between the lid and the base is the most difficult to achieve because of the need for flatness of such a relatively large area contact in order to provide the desired hermetic seal. Obtaining this seal is simplified by inclusion of a gold gasket between the lid and the base along this seal line. This gold gasket may fill in any valleys in either of the frames which might otherwise fail to seal.

This all-directly-bonded package has enormous advantages for power devices which are likely to operate at high temperatures. Since no solder is used within this directly bonded package, the highest available temperature solder can be used to mount the packaged device in a circuit, thereby maximizing the possible device operation temperature. If the circuit in which the device is connected is solder free and the device is mounted without solder, then the limit on maximum device operating temperature is derived from the lowest maximum safe temperatures among all of the components in the circuit and is not dependent on solder melting or softening temperatures.

The package which has been illustrated and described in connection with the embodiment illustrated in FIGS. 1-13 is an all copper package in the sense that all of the conductors therein are copper and the package is free of magnetic materials, unless such materials are intentionally introduced into the package such as a non-saturable ferrite core to reduce the circuit rise time. This all copper package has a very low electrical resistance because all of its leads are copper which is significantly more conductive than the metals used for through-the-can leads in prior art packages. The thermal resistance of this package is also less than that of prior hermetic packages because copper is a substantial better thermal conductor than the materials from which prior art hermetic packages are fabricated.

An MCT (MOS controlled thyristor) packaged in the package 90 of FIGS. 12 and 13 had a measured lead inductance of about 1 nanohenry as compared to the typical prior art values of 10 nanohenrys or more. This low inductance value is essentially independent of the type of device so long as the current flows vertically through the chip or die. Several things contribute to this low inductance level. One is the total absence of wire bonds, since wire bond wires have substantial inductance. Another is the total absence of magnetic materials from the semiconductor package with the result that there is no magnetic material present to enhance any inductive effects present within the package. Third, the use of wide, flat, short leads provides a minimum inductance. This packaged device had external dimensions of 0.400×0.600×0.09 inch high (10.2×15.2×2.25 mm) (without a base plate extension beyond the frame 84) and 1.00×0.600×0.09 inch high (25.4×15.2×2.25 mm) with a base extension. These two configurations weigh 3 gm and 3.7 gm, respectively. A typical prior art hermetically packaged MCT of the same chip size is typically packaged in a TO-3 package which is diamond-shaped and is 1.0×1.5×0.25 inch high (25.4×38×6.3 mm) and weighs 11.3 gm.

The smaller size of this package for a given semiconductor chip size is a direct result of the leads coming vertically through the lid of the package. This reduced package size provides a greater fatigue life for the package with temperature cycling and other stresses because of the smaller linear dimensions over which the thermal expansion mismatch works.

The package illustrated in FIG. 12 is ideal for packaging chips to be included within a high reliability hybrid circuit since, where the package is to be soldered down directly, the extension of the base plate may be omitted and the package becomes only slightly larger than the size of the chip, is lightweight and hermetically sealed. Consequently, the resulting hybrid circuit does not need to be separately hermetically sealed in order for the semiconductor devices to be hermetically sealed. Thus, this package provides substantial savings in weight, size and inductance when used in high reliability hybrid circuits.

The package illustrated in FIGS. 1-12 is suitable for packaging chips up to about 250×400 mils (6.3×10.2 mm). However, for larger chips, insulating material which may be used for the lid and any isolation block on the package base include alumina ($Al_2O_3$), beryllia (BeO), aluminum nitride (AlN), silicon carbide (SiC) and so forth. The mismatch in thermal expansion among the copper base, the chip and the alumina lid becomes large enough to present reliability concerns. The size of chips which can be packaged in this type of package without raising reliability concerns may be increased by substituting a copper molybdenum laminate or a copper tungsten laminate for the copper base plate 82. In both of these laminates, both exterior surfaces of the laminate are copper and the non-copper material (molybdenum or tungsten) forms the center core of the laminate. Where a base plate 20 mils thick is desired, that laminate may, for example, have 10 mils of molybdenum or tungsten as the central layer of the laminate and 5 mils of copper bonded to each surface of that central layer to provide a 20 mil thick laminate. The copper molybdenum laminate with these dimensions has a relative thermal coefficient of expansion of about 7 while the tungsten copper laminate has a thermal coefficient of expansion of about 5. As is well known in the art, silicon has a thermal coefficient of expansion of about 3, aluminum nitride has a thermal coefficient of expansion of about 4, alumina has a thermal coefficient of expansion of about 7, beryllia has a thermal coefficient of expansion of about 8 and copper has a thermal coefficient of expansion of about 16. Thus, it can be seen that by substituting a copper molybdenum or copper tungsten laminate for plain copper in combination with appropriate materials for the lid, the thermal coefficient of expansion mismatch among the components of the package may be greatly reduced.

Where even larger packages are needed than can be provided using the copper molybdenum laminate or the copper tungsten laminate, the copper foil electrodes 76 may be made with a mosaic or grid configuration in which rectangular or other shape patches of the foil are direct bonded to the substrate in a grid-like configuration with the foil between these direct bonded segments being arched upward away from the substrate to prevent direct bonding and in order to provide strain relief in the copper foil over long distances.

It is generally preferred to have the apertures 73 in the lid 70 only slightly greater in diameter than the diameter of the copper balls. However, as the size of a chip increases, it becomes desirable to use a larger aperture in order to provide increased compliance at the copper balls during temperature cycling in which the semiconductor device expands at a different rate than the ceramic 72 of the lid due to temperature gradients and differing coefficients of thermal expansion. The copper foil at the dimple provides sufficient flexibility to accommodate the resulting movement and thereby provides the strain relief which is provided by the wire bonds in prior art packages.

In order to provide maximum thermal conductivity, it is preferred that the chip be bonded to the base of the package even where no electrical contact is required to the base of the package. However, this joint may be left unbonded, if desired.

While a package containing only a single chip has been illustrated and described, it will be recognized that the same type of package may be used for multiple chips. Multiple chips may be mounted in a single large cavity provided by a peripheral base frame or may be mounted in separate cavities by providing a base frame with interior partitions much like the moldings which support the glass panes of a multipane window. Where multiple cavities are employed, a single cover having a frame which is a mate for the base frame may be used. Alternatively, the base frame may be designed with wide partitions configured to allow each cavity in the base frame to be sealed using a separate lid whereby each device has its own lid, but a base in common with all of the other devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of packaging a semiconductor device comprising the steps of:
    providing said semiconductor device in the form of a chip having a contact pad on a first surface thereof;
    bonding a conductive pellet to said contact pad in a predetermined location;
    providing a lid including an electrically insulating substrate having an aperture therein, said aperture being disposed in a location which corresponds to the location of said conductive pellet on said chip;
    providing a conductive foil on the surface of said substrate opposite said chip, said conductive foil extending across said aperture and being bonded to said substrate in a configuration to hermetically seal said aperture within said package; and
    bringing said first surface of said chip into close proximity with said lid and aligning said conductive pellets with said aperture and bringing said chip and lid close enough together that said conductive pellet extends into said aperture with which it is aligned.

2. The method recited in claim 1 wherein said step of bonding said conductive pellet to said contact pad comprises the steps of:
    forming a plurality of gold bumps on said contact pad; and
    bonding said conductive pellet to a plurality of said gold bumps.

3. The method recited in claim 2 wherein:
    the step of bonding said conductive pellet to said gold bumps comprises:
    soldering said conductive pellet to said gold bumps.

4. The method recited in claim 2 wherein said step of bonding said conductive pellet to said gold bumps comprises:

thermocompression bonding said conductive pellet to said gold bumps.

5. The method recited in claim 1 further comprising the step of:

disposing a base across the side of said chip opposite said first surface and sealing said base to said lid to hermetically seal said package.

6. The method recited in claim 5 wherein:

the step of disposing said base comprises the step of disposing a frame between said lid and said base with said chip in an aperture of said frame; and the step of sealing comprises sealing said frame to said base and said lid.

* * * * *